(12) United States Patent
Osanai et al.

(10) Patent No.: US 11,919,288 B2
(45) Date of Patent: Mar. 5, 2024

(54) METHOD FOR PRODUCING HEAT RADIATION MEMBER

(71) Applicant: DOWA METALTECH CO., LTD., Tokyo (JP)

(72) Inventors: Hideyo Osanai, Tokyo (JP); Akira Sugawara, Tokyo (JP)

(73) Assignee: DOWA METALTECH CO., LTD., Tokyo (JP)

( * ) Notice: Subject to any disclaimer, the term of this patent is extended or adjusted under 35 U.S.C. 154(b) by 22 days.

(21) Appl. No.: 17/468,808

(22) Filed: Sep. 8, 2021

(65) Prior Publication Data

US 2022/0080704 A1 Mar. 17, 2022

(30) Foreign Application Priority Data

Sep. 15, 2020 (JP) .................. 2020-154844

(51) Int. Cl.
| | |
|---|---|
| *B22D 19/04* | (2006.01) |
| *B23K 1/19* | (2006.01) |
| *B32B 9/00* | (2006.01) |
| *B32B 9/04* | (2006.01) |
| *H05K 1/02* | (2006.01) |

(Continued)

(52) U.S. Cl.
CPC ............. *B32B 9/041* (2013.01); *B22D 19/04* (2013.01); *B23K 1/19* (2013.01); *B32B 9/007* (2013.01); *H05K 1/0201* (2013.01); *H05K 7/2039* (2013.01); *B23K 1/0016* (2013.01); *B23K 2101/36* (2018.08); *B32B 2250/03* (2013.01); *B32B 2250/40* (2013.01);

(Continued)

(58) Field of Classification Search
None
See application file for complete search history.

(56) References Cited

U.S. PATENT DOCUMENTS 7,122,243 B2 * 10/2006 Osanai ................ H01L 23/3735
257/730
7,487,585 B2 * 2/2009 Osanai .................. H01L 23/142
29/841

(Continued)

FOREIGN PATENT DOCUMENTS

| JP | 2005074434 A | * | 3/2005 |
|---|---|---|---|
| JP | 2006-282417 | | 10/2006 |

(Continued)

*Primary Examiner* — Devang R Patel
(74) *Attorney, Agent, or Firm* — Clark & Brody LP

(57) ABSTRACT

To provide a heat radiation member having high durability that can favorably retain the thermal conductivity under application of heat cycles, suitable for mounting a semiconductor element of a power module. The heat radiation member includes a laminated structure including metal materials 21 and 22 and a carbon material 10 having the following property (A) bonded to each other; (A) in pressurizing one principal surface of a plate specimen having a thickness of 11 mm of the carbon material with nitrogen gas of 200 kPa, the carbon material having a gas permeability of the nitrogen gas permeating to the other principal surface with a flow rate of 5 L/min or more and 30 L/min or less per 0.01 m² in terms of area of the pressurized principal surface, the pressurized principal surface having an area of 0.005 m² or more.

2 Claims, 6 Drawing Sheets

(51) Int. Cl.
*H05K 7/20* (2006.01)
*B23K 1/00* (2006.01)
*B23K 101/36* (2006.01)

(52) U.S. Cl.
CPC ... *B32B 2307/302* (2013.01); *B32B 2307/724* (2013.01); *B32B 2457/08* (2013.01)

(56) References Cited

U.S. PATENT DOCUMENTS

| | | | |
|---|---|---|---|
| 8,011,416 B2* | 9/2011 | Osanai | C04B 37/026 |
| | | | 164/419 |
| 10,043,729 B1* | 8/2018 | Manninen | H01L 23/3735 |
| 10,497,637 B2* | 12/2019 | Terasaki | B23K 11/22 |
| 10,898,946 B2* | 1/2021 | Tanaka | B22C 3/00 |
| 2007/0058349 A1* | 3/2007 | Ishikawa | H01L 23/3735 |
| | | | 257/E23.106 |
| 2012/0152482 A1* | 6/2012 | Osanai | B22D 19/0072 |
| | | | 164/112 |
| 2018/0040533 A1* | 2/2018 | Terasaki | H01L 23/3735 |
| 2020/0278161 A1* | 9/2020 | Maekawa | H01L 23/3733 |

FOREIGN PATENT DOCUMENTS

| | | |
|---|---|---|
| JP | 2011-077389 | 4/2011 |
| JP | 2012-199452 | 10/2012 |
| JP | 2014-082466 | 5/2014 |
| JP | 2019-096858 | 6/2019 |
| WO | 2008/093808 | 8/2008 |

* cited by examiner

[Fig.1]
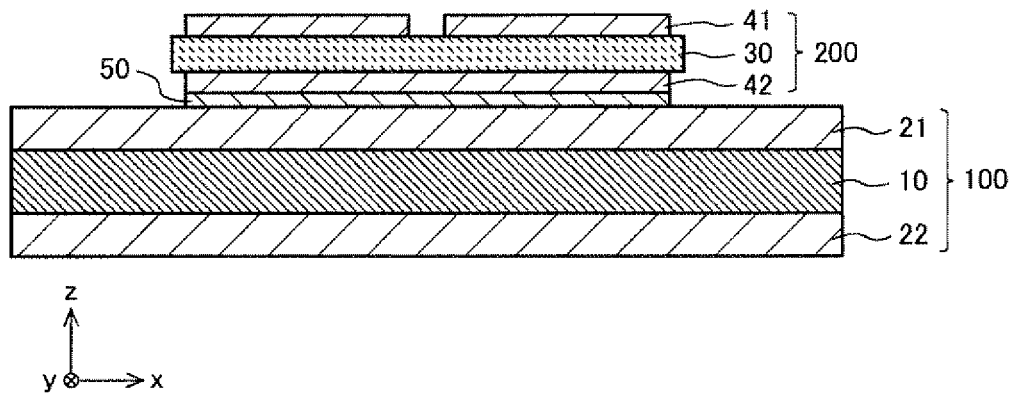
[Fig.2]
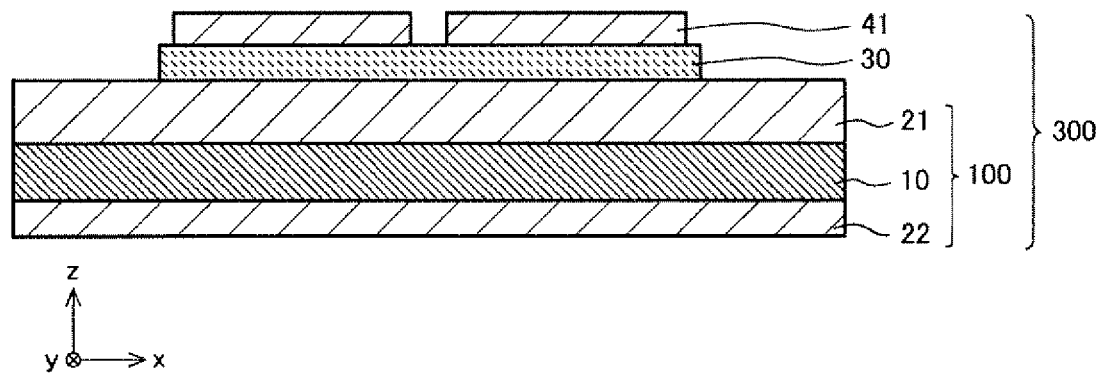
[Fig.3]
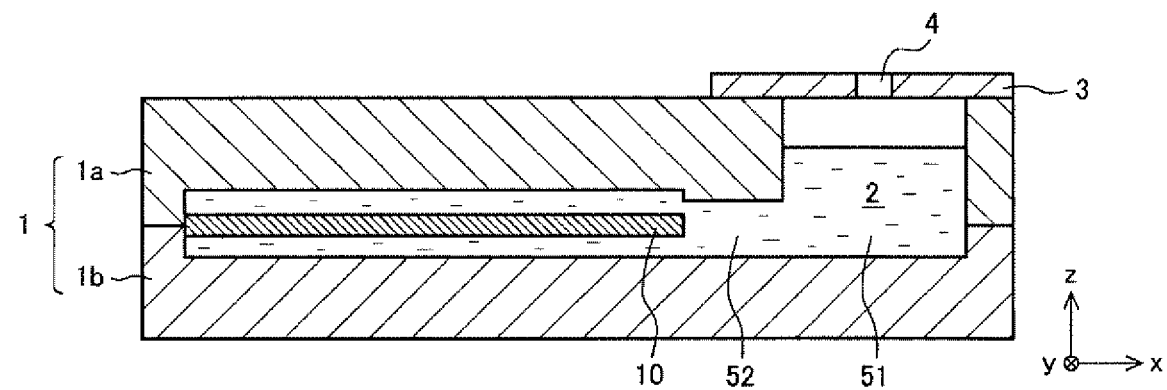

[Fig.4]
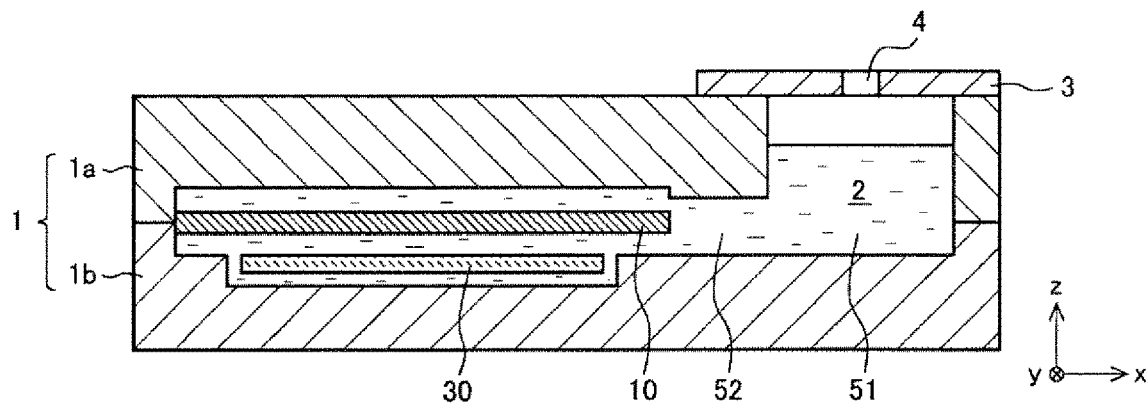
[Fig.5]
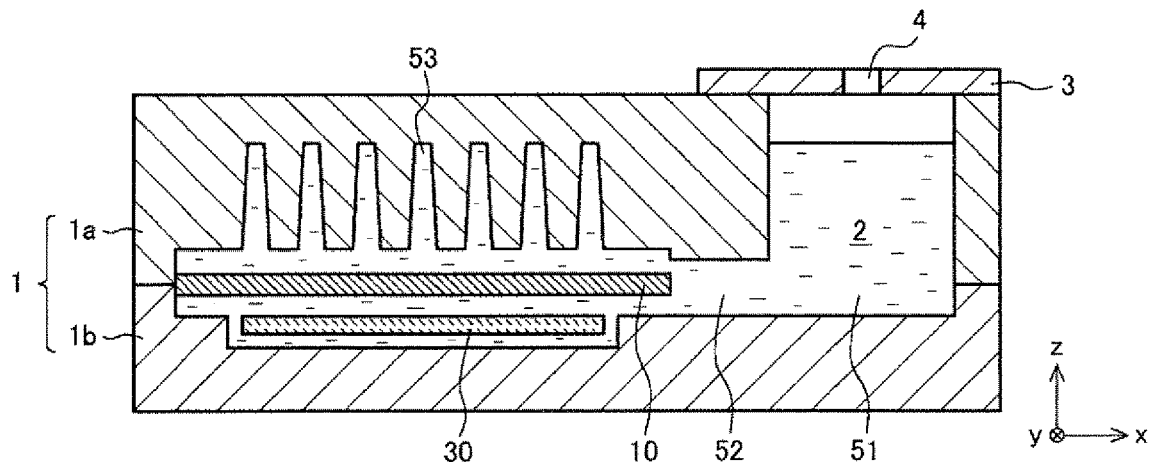
[Fig.6]
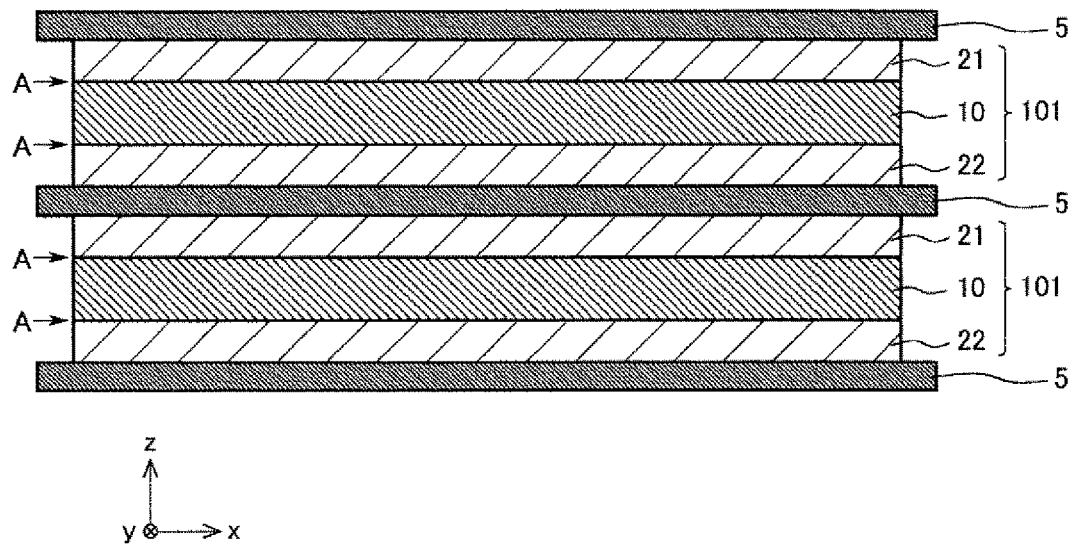

[Fig.7]
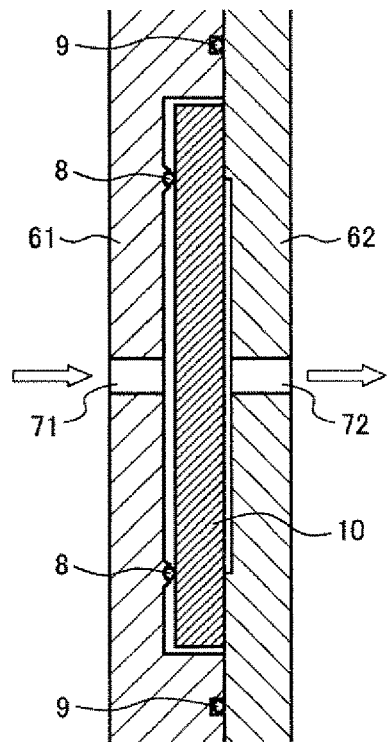
[Fig.8]
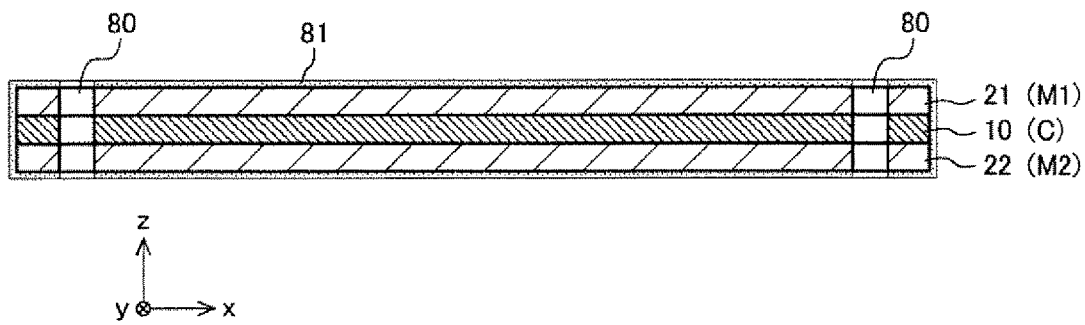
[Fig.9]
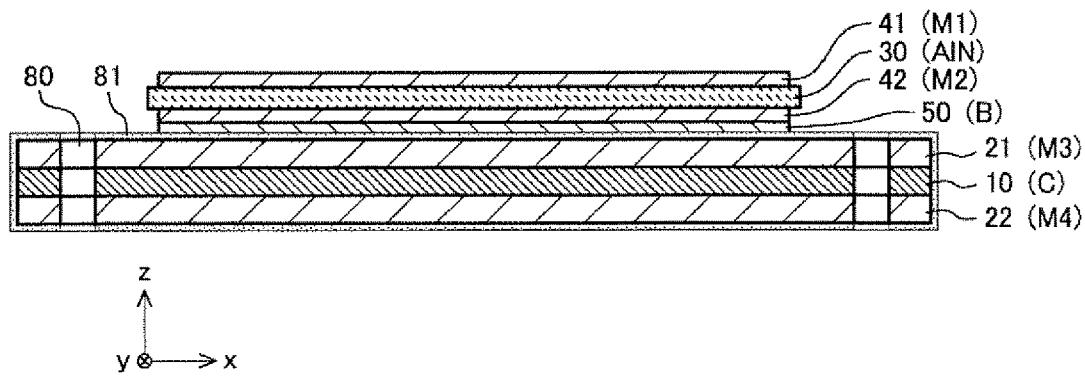

[Fig.10]
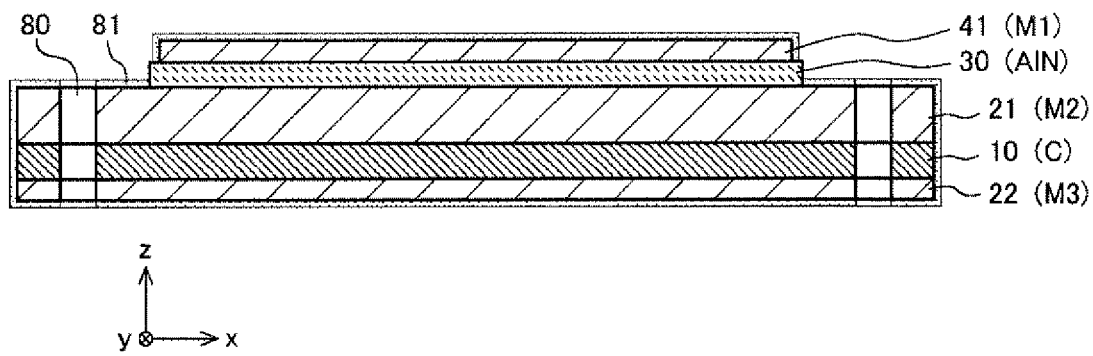
[Fig.11]
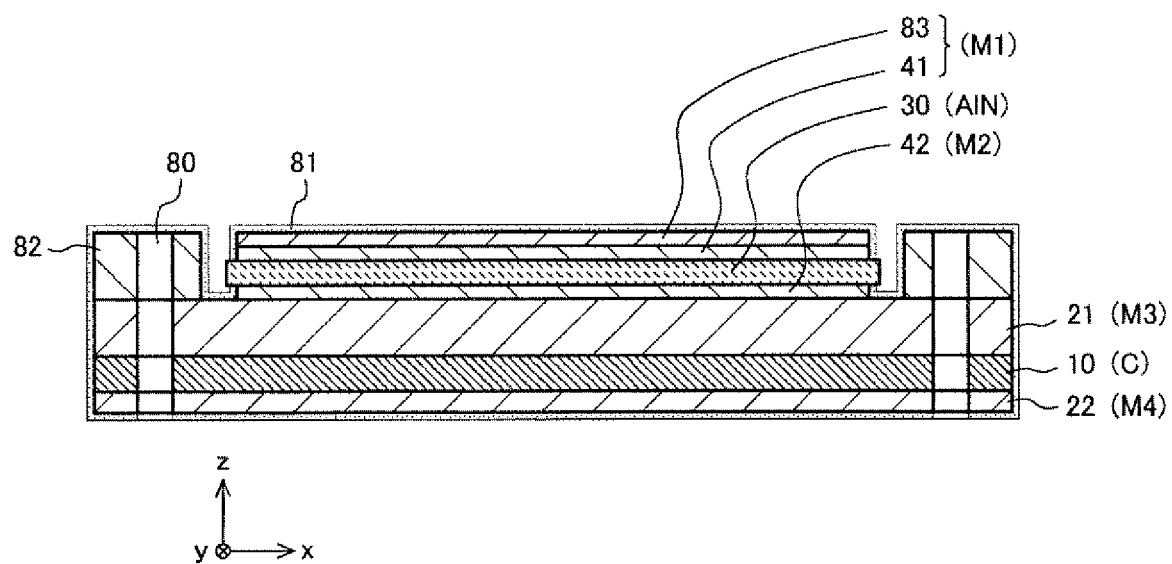

METHOD FOR PRODUCING HEAT RADIATION MEMBER

BACKGROUND OF THE INVENTION

Technical Field

The present invention relates to a heat radiation member suitable for a semiconductor device, such as a power module, and a method for producing the same. The heat radiation member herein is a heat transfer member that transfers heat generated from a heat generator, such as a semiconductor element, to a cooling medium (such as air and liquid) and a chassis.

Background Art

A semiconductor element used in a power module is generally mounted on an insulated circuit board including a ceramic board having bonded on both sides thereof metal plates. On the back side of the insulated circuit board opposite to the surface thereof having the semiconductor element mounted, in general, a heat radiation base using a metal material (i.e., a heat transfer member, such as a metal base plate) is disposed, so as to constitute a heat radiation structure including the heat radiation base and the insulated circuit board integrated with each other. The heat radiation structure is demanded to have a function capable of preventing the deformation caused by the difference in thermal expansion between the ceramics and the metal, and the occurrence of bonding failure (such as cracks, exfoliation, and formation of voids) among the constitutional materials due to thermal stress.

JP-A-2006-282417 describes the technique using a metal plate formed of copper or a copper alloy having a Vickers hardness of 40 to 60, as a metal plate for fixing a heat radiation plate constituting a metal-ceramics bonded board (insulated circuit board). The literature states that according to the technique, even though Pb-free solder is used for fixing the heat radiation plate (metal base plate) to the metal plate for fixing the heat radiation plate, cracks can be effectively prevented from occurring in the solder and the ceramic board. However, there is a problem that the occurrence of cracks in the ceramic board cannot be sufficiently prevented under application of heat cycles.

JP-A-2019-96858 describes the heat transfer member including a carbon plate having a cast molded article covering the surface thereof. A laminate of graphene is used as the carbon plate. Graphene has a problem that the thermal resistance at the interface between graphene and a metal is increased due to the brittleness of graphene, and the thermal conductivity as the heat transfer member is lowered (see paragraphs 0004 and 0007), but it is stated that according to the technique of JP-A-2019-96858, the cast molded article is in surface contact with the surface of the carbon plate, and simultaneously the cast molded article presses the surface of the plate, increasing the adhesion thereto, due to the difference in shrinkage between the cast molded article and the plate in forming the cast molded article, resulting in the enhancement of the thermal conductivity of the composite heat transfer member (see paragraphs 0011, 0012, and 0050). It is also stated that residual stress remains in each of the cast molded article and the carbon plate, and even in the use at a high temperature of approximately 150° C., the residual stress is not lost even decreases, and therefore the cast molded article continuously presses the surface of the carbon plate (see paragraphs 0051 and 0052). However, the technique described in JP-A-2019-96858 has room of improvement in durability against the decrease in bonding strength and the exfoliation at the interface between the cast molded article and the carbon plate (i.e., the graphene laminate) under application of heat cycles.

WO 2008/093808 describes the use of a stress relaxation plate made of a composite material including a porous sintered article of carbon impregnated with aluminum or an alloy thereof, as intermediate plates bonded to the front and back surfaces of the ceramic board in an insulated circuit board mounting a semiconductor element. It is thought that as the porous sintered article of carbon used, for example, a commercially available artificial graphite material (density: 1.85 g/cm$^3$, porosity: 12 vol %, bending strength: 3.5 kg/cm$^2$, thermal conductivity: 100 W/m·K, thermal expansion rate: $3.8 \times 10^{-6}$/° C.) may be cut out and used (see paragraph 0040). JP-A-2006-298687 describes the heatsink material having enhanced contact between a porous sintered article and a metal by the method of impregnating the porous sintered article formed of carbon or graphite with the metal. However, it has been found that in these composite materials using a porous material of carbon, the thermal conductivity is readily decreased in some cases under application of heat cycles. It is considered that this occurs since due to the low strength of the porous sintered article of carbon, voids or exfoliation tends to occur at the surface thereof in contact with the impregnated metal or the surface thereof in contact with a metal film covering the periphery thereof, due to the repeated application of thermal stress caused by the heat cycles. Furthermore, high temperature and high pressure are required for sufficiently impregnating a porous material of carbon with a metal into interiors of fine pores thereof, and it is difficult to produce a metal-carbon composite material that sufficiently retains the thermal conductivity and the strength.

JP-A-2011-77389, JP-A-2012-199452, and JP-A-2014-82466 describe the techniques of inserting a reinforcing material in a bar form or a plate form having a small thermal expansion coefficient into the interior of a metal base plate, so as to relax the thermal expansion of the base plate. However, these techniques may also have a problem of bonding failure between the base plate matrix metal and the reinforcing material under repeated application of heat cycles, and thus have room of improvement.

SUMMARY OF THE INVENTION

A carbon material has a thermal expansion coefficient close to ceramics and good thermal conductivity, and thus is useful as a constitutional material of a heat radiation member bonded to an insulated circuit board using ceramics. However, there is a demand for improvement in durability in the case where thermal stress is repeatedly applied due to heat cycles as described above. An object of the present invention is to provide a heat radiation member using a composite material of a metal and a carbon material that is capable of retaining good thermal conductivity even in the case where heat cycles are repeatedly applied to the heat radiation member, i.e., in the case where the heat radiation member is exposed to a severe thermal stress environment with repeated application of rapid variation of thermal stress due to increase and decrease of temperature.

The object can be achieved by a heat radiation member including a laminated structure having a metal material and a carbon material having the following property (A) bonded to each other.

(A) In pressurizing one principal surface of a plate specimen having a thickness of 11 mm of the carbon material with nitrogen gas of 200 kPa, the carbon material has a gas permeability of the nitrogen gas permeating to the other principal surface with a flow rate of 5 L/min or more and 30 L/min or less per 0.01 m² in terms of area of the pressurized principal surface, provided that the pressurized principal surface has an area of 0.005 m² or more.

The "principal surface" herein means the surface at the end in the thickness direction of the plate. A plate has two principal surfaces facing each other.

The carbon material is preferably a CIP, cold isostatic press, molded graphitized material. The carbon material preferably has a strength in terms of bending strength of 40 MPa or more. The metal material constituting the laminated structure is preferably any of aluminum, an aluminum alloy, copper, and a copper alloy.

The laminated structure is preferably a laminated structure including the carbon material having bonded to both sides thereof the metal materials. In this case, the metal materials holding the carbon material therebetween may be members that are separated from each other. Specifically, there is no necessity of using a structure referred to as "cast coating", in which the carbon material is sealed inside the metal material, and a structure having the metal materials holding the carbon material therebetween that are connected to and integrated with each other somewhere. In application of the structure having the metal materials holding the carbon material therebetween that are separated from each other, the area ratio of the region where the carbon material exists occupied in the region where the metal materials holding the carbon material therebetween overlap each other in a projected area viewed in the laminated direction is preferably 90% or more. The metal material bonded to the carbon material may have a surface having a plated layer formed thereon.

Examples of the bonded structure of the metal material and the carbon material include a structure, in which a molten metal of the metal material is bonded to the surface of the carbon material through solidification thereon, and a structure, in which the metal material and the carbon material are bonded by a brazing method.

The heat radiation member of the present invention may be a heat radiation structure including a heat transfer member, such as a ceramic material, as far as the heat radiation member includes the laminated structure having the metal material and the carbon material having the property (A) bonded to each other. Examples of the heat radiation member of the present invention that includes the ceramic material include a type of a heat radiation structure including a "heat radiation base" including the metal material and the carbon material having the property (A) bonded to each other, and bonded thereto an "insulated circuit board" including a heat radiation metal material, ceramics, and a circuit metal material laminated in this order and integrated with each other. The expression "laminated in this order" for the insulated circuit board means the positional relationship of the laminated members, in which the ceramics exist adjacent to the heat radiation metal material, the circuit metal material exists adjacent to the ceramics on the opposite side to the heat radiation metal material. Accordingly, bonding interfaces exist between the heat radiation metal material and the ceramics, and between the ceramics and the circuit metal material. Examples thereof also include a type of a heat radiation structure including a ceramic material bonded to form an insulated circuit board, directly on the surface of the metal material bonded to the carbon material opposite to the carbon material. In any type, in the case where the metal materials are bonded to both sides of the carbon material, it suffices that the ceramic material is disposed on the surface of any one of the metal materials opposite to the carbon material. The circuit metal material is for forming a circuit by mounting a semiconductor element thereon. The "heat radiation base" and the "insulated circuit board" described above may be bonded to each other via any of a brazing material layer, a solder layer, and a sintered metal layer.

The method for producing the heat radiation member including a carbon material and a metal material bonded to each other may be the following methods applied depending on the bonding method of the carbon material and the metal material, which may be "molten metal bonding" or "brazing".

[Molten Metal Bonding]

The method for producing the heat radiation member includes charging a molten metal of aluminum or an aluminum alloy in a cast mold having a carbon material having the property (A) disposed therein, so as to fill the space inside the cast mold with the molten metal, and then solidifying the molten metal, so as to form a laminated structure including a metal material containing aluminum or an aluminum alloy and the carbon material bonded to each other.

[Brazing]

The method for producing the heat radiation member includes bonding a metal material and a carbon material having the property (A) by brazing, so as to form a laminated structure including the metal material and the carbon material bonded to each other.

In the description herein, more specifically, the following inventions are disclosed.

[1] A heat radiation member including a laminated structure including a metal material and a carbon material having the following property (A) bonded to each other;

(A) in pressurizing one principal surface of a plate specimen having a thickness of 11 mm of the carbon material with nitrogen gas of 200 kPa, the carbon material having a gas permeability of the nitrogen gas permeating to the other principal surface with a flow rate of 5 L/min or more and 30 L/min or less per 0.01 m² in terms of area of the pressurized principal surface, the pressurized principal surface having an area of 0.005 m² or more.

[2] The heat radiation member according to the item [1], wherein the carbon material is a CIP, cold isostatic press, molded graphitized material.

[3] The heat radiation member according to the item [1] or [2], wherein the metal material constituting the laminated structure is any of aluminum, an aluminum alloy, copper, and a copper alloy.

[4] The heat radiation member according to any one of the items [1] to [3], wherein the heat radiation member includes a laminated structure including the carbon material having bonded to both sides thereof the metal materials, and the metal materials holding the carbon material therebetween are separated from each other.

[5] The heat radiation member according to the item [4], wherein an area ratio of a region where the carbon material exists occupied in a region where the metal materials holding the carbon material therebetween overlap each other in a projected area viewed in a laminated direction is 90% or more.

[6] The heat radiation member according to any one of the items [1] to [5], wherein the heat radiation member has a laminated structure, in which the metal material and the carbon material are bonded to each other through solidification of a molten metal of the metal material on a surface of the carbon material.

[7] The heat radiation member according to any one of the items [1] to [5], wherein the heat radiation member has a laminated structure, in which the metal material and the carbon material are bonded by a brazing method.

[8] The heat radiation member according to any one of the items [1] to [7], wherein the heat radiation member includes a laminated structure including an insulated circuit board including a heat radiation metal material, a ceramic material, and a circuit metal material laminated in this order and integrated with each other, and the heat radiation metal material is bonded to the metal material bonded to the carbon material (which is any one of the metal materials in the case where the metal materials are bonded to both sides of the carbon material) on the opposite side to the carbon material.

[9] The heat radiation member according to the item [8], wherein the heat radiation member has a laminated structure, in which the metal material bonded to the carbon material and the heat radiation metal material of the insulated circuit board are bonded to each other via any of a brazing material layer, a solder layer, and a sintered metal layer.

[10] The heat radiation member according to any one of the items [1] to [7], wherein the heat radiation member includes a laminated structure including a ceramic material bonded to the metal material bonded to the carbon material (which is any one of the metal materials in the case where the metal materials are bonded to both sides of the carbon material) on the opposite side to the carbon material.

[11] The heat radiation member according to the item [10], wherein the heat radiation member includes a laminated structure including a circuit metal material bonded to the ceramic material on the opposite side to the metal material.

[12] The heat radiation member according to any one of the items [1] to [11], wherein the metal material bonded to the carbon material has a surface having a plated layer formed thereon.

[13] The heat radiation member according to any one of the items [1] to [12], wherein the carbon material has a bending strength of 40 MPa or more.

[14] A method for producing a heat radiation member including charging a molten metal of aluminum or an aluminum alloy in a cast mold having a carbon material having the following property (A) disposed therein, so as to fill a space inside the cast mold with the molten metal, and then solidifying the molten metal, so as to form a laminated structure including a metal material containing aluminum or an aluminum alloy and the carbon material bonded to each other;

(A) in pressurizing one principal surface of a plate specimen having a thickness of 11 mm of the carbon material with nitrogen gas of 200 kPa, the carbon material having a gas permeability of the nitrogen gas permeating to the other principal surface with a flow rate of 5 L/min or more and 30 L/min or less per 0.01 m$^2$ in terms of area of the pressurized principal surface, the pressurized principal surface having an area of 0.005 m$^2$ or more.

[15] A method for producing a heat radiation member including bonding a metal material and a carbon material having the property (A) by a brazing method, so as to form a laminated structure including the metal material and the carbon material bonded to each other;

(A) in pressurizing one principal surface of a plate specimen having a thickness of 11 mm of the carbon material with nitrogen gas of 200 kPa, the carbon material having a gas permeability of the nitrogen gas permeating to the other principal surface with a flow rate of 5 L/min or more and 30 L/min or less per 0.01 m$^2$ in terms of area of the pressurized principal surface, the pressurized principal surface having an area of 0.005 m$^2$ or more.

[16] The method for producing a heat radiation member according to the item [15], wherein the metal material constituting the laminated structure is any of aluminum, an aluminum alloy, copper, and a copper alloy.

[17] The method for producing a heat radiation member according to any one of the items [14] to [16], wherein the carbon material has a bending strength of 40 MPa or more.

According to the present invention, a heat radiation member excellent in durability with significantly small deterioration in thermal conductivity under application of heat cycles can be achieved by using the carbon material having good thermal conductivity and a thermal expansion coefficient close to ceramics.

BRIEF DESCRIPTION OF DRAWINGS

FIG. 1 is an illustration schematically showing the cross sectional structure of a type of a heat radiation member according to the present invention including a heat radiation base and an insulated circuit board bonded to each other.

FIG. 2 is an illustration schematically showing the cross sectional structure of the type of the heat radiation member according to the present invention including a ceramic material bonded directly to a metal material bonded to a carbon material, so as to form the insulated circuit board.

FIG. 3 is an illustration schematically showing the cross section of a cast mold for producing a "heat radiation base" by a molten metal bonding method.

FIG. 4 is an illustration schematically showing the cross section of the cast mold for producing a "base-integrated insulated circuit board" by the molten metal bonding method.

FIG. 5 is an illustration schematically showing the cross section of the cast mold having cavities for forming fins, for producing the "base-integrated insulated circuit board" having heat radiation fins by the molten metal bonding method.

FIG. 6 is an illustration showing the cross section of the laminate in the case where the metal material and the carbon material constituting the heat radiation base are bonded by a brazing method.

FIG. 7 is an illustration schematically showing the cross section of the jig for binding the carbon material in the measurement of the gas permeability of the carbon material.

FIG. 8 is an illustration schematically showing the cross sectional structure of a heat radiation base product as a specimen.

FIG. 9 is an illustration schematically showing the cross sectional structure of the heat radiation member including the heat radiation base and the insulated circuit board as a specimen.

FIG. 10 is an illustration schematically showing the cross sectional structure of the heat radiation member including a base-integrated insulated circuit board product as a specimen.

FIG. 11 is an illustration schematically showing the cross sectional structure of the heat radiation member including the base-integrated insulated circuit board product as a specimen.

DETAILED DESCRIPTION OF THE EMBODIMENTS

Figure 12A:
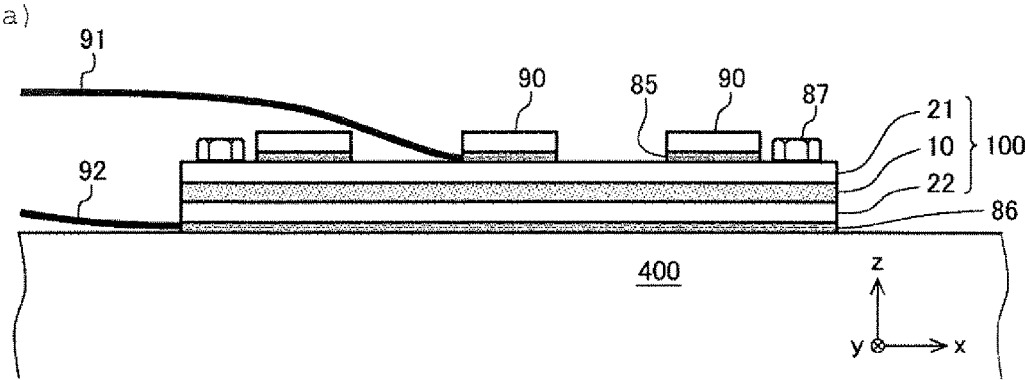
FIGS. 12A and 12B are a side view and a plane view respectively for explaining a thermal conductivity measurement method of the specimen (which is the heat radiation base alone).

FIG. 1 schematically shows the cross sectional structure of a type of a heat radiation member according to the present invention including a heat radiation base and an insulated circuit board bonded to each other. A heat radiation base 100 and an insulated circuit board 200 are bonded to each other via a bonding metal layer 50. The bonding metal layer 50 may be a brazing material layer, a solder layer, a sintered metal layer, or the like. The insulated circuit board 200 includes a ceramic material 30 having on one side thereof a circuit metal material 41, and on the opposite side thereof a heat radiation metal material 42. A semiconductor element of a power module is mounted on the circuit metal material 41. For radiating heat from the semiconductor element, which is a heat generator, ceramics having good thermal conductivity, such as aluminum nitride, ceramics having high strength, such as silicon nitride, or inexpensive ceramics, such as alumina, are frequently used as the ceramic material 30, and a metal having a high thermal conductivity mainly containing Al or Cu is applied to the circuit metal material 41 and the heat radiation metal material 42. Representative examples of the product of the insulated circuit board 200 include an "aluminum bonded ceramic circuit board" having an aluminum-ceramics-aluminum laminated structure and a "copper bonded ceramic circuit board" having a copper-ceramics-copper laminated structure.

The heat radiation base 100 functions as a heat transfer member for transferring heat from the insulated circuit board 200 to a heat radiation article, such as a heatsink, and also functions as a fixing member for disposing the insulated circuit board 200 in a chassis. In the example shown in FIG. 1, a carbon material 10 is used as a constitutional material of the heat radiation base 100. The heat radiation base 100 has a laminated structure including the carbon material 10 having bonded on both sides thereof metal materials 21 and 22. The carbon material 10 and the metal materials 21 and 22 are bonded through solidification of the molten metal of the metal material on the surface of the carbon material 10, or bonded by brazing. The carbon material has a thermal expansion coefficient close to ceramics and has good thermal conductivity. The carbon material 10 is tightly bonded to the metal materials 21 and 22, and therefore the difference in thermal expansion between the heat radiation base 100 and the insulated circuit board 200 can be retained small, preventing the problems, such as the local deformation of the heat radiation member including the heat radiation base 100 and the insulated circuit board 200 integrated with each other (for example, the warpage of the heat radiation base 100) and the damage of the bonding metal layer 50 (for example, occurrence of cracks and exfoliation).

FIG. 2 schematically shows the cross sectional structure of the type of the heat radiation member according to the present invention including the ceramic material bonded directly to the metal material bonded to the carbon material, so as to form an insulated circuit board. The heat radiation member has a laminated structure including the carbon material 10 bonded to the metal materials 21 and 22. The carbon material 10 and the metal materials 21 and 22 are bonded through solidification of the molten metal of the metal material on the surface of the carbon material 10, or bonded by brazing. The ceramic material 30 is bonded directly to the side of the metal material 21 opposite to the carbon material. The circuit metal material 41 for mounting a semiconductor element of a power module is bonded onto the ceramic material 30. The heat radiation base 100 constituted by the carbon material 10 and the metal materials and 22 bonded on both sides thereof constitutes an insulated circuit board 300 along with the ceramic material 30 and the circuit metal material 41. This type of the heat radiation structure may be referred to as a "base-integrated insulated circuit board". In this case, also, the carbon material 10 is tightly bonded to the metal materials 21 and 22, and therefore the difference in thermal expansion between the heat radiation base 100 and the ceramic material 30 can be retained small, preventing the problems, such as the local deformation of the insulated circuit board 300 and the damage of the ceramic material 30.

In the heat radiation members shown in FIGS. 1 and 2, the portion where the metal surface is exposed may be plated with Ni, a Ni alloy, Au, or the like, depending on necessity. A heatsink, such as fins, may be provided on the side of the metal material 22 opposite to the carbon material 10. The surface of the metal material 22 opposite to the carbon material 10 may be cooled with a cooler using a liquid cooling medium.

In the heat radiation member including the carbon material 10 having bonded on both sides thereof the metal materials 21 and 22, e.g., the heat radiation base 100 shown in FIGS. 1 and 2, the metal materials 21 and 22 holding the carbon material 10 therebetween may be constituted by members that are separated from each other. The expression "separated from each other" means that the metal materials on both sides of the carbon material are not integrated with each other in casting, but the metal surfaces thereof are not in direct contact with each other. In the heat radiation member of the present invention, a "metal-carbon-metal sandwich structure" including the metal materials that are separated from each other with the carbon material intervening therebetween may be employed due to the high bonding strength between the carbon material 10 and the metal materials 21 and 22. In the case where the laminated structure of the metal material 21, the carbon material 10, and the metal material 22 is to be obtained by the "brazing method" as described later, the carbon material having a smaller area than the metal materials may be held thereby. From the standpoint of the sufficient securement of the thermal conductivity between the metal materials 21 and 22, the area ratio of the region where the carbon material exists occupied in the region where the metal materials holding the carbon material therebetween overlap each other in a projected area viewed in the laminated direction (i.e., the z axis direction shown in FIGS. 1 and 2) is preferably 90% or more.

[Carbon Material]

In the present invention, the carbon material constituting the laminated structure along with the metal material has the following property (A).

(A) In pressurizing one principal surface of a plate specimen having a thickness of 11 mm of the carbon material with nitrogen gas of 200 kPa, the carbon material has a gas permeability of the nitrogen gas permeating to the other principal surface with a flow rate of 5 L/min or more and 30 L/min or less per 0.01 m$^2$ in terms of area of the pressurized principal surface, provided that the pressurized principal surface has an area of 0.005 m² or more.

By securing a plate thickness of 11 mm and an area of the pressurized principal surface of 0.005 m² or more, the measurement accuracy can be enhanced, and the difference among materials can be clearly comprehended. With a too large plate thickness, the pressurizing force is necessarily increased, requiring a large equipment therefor, and a plate thickness of 11 mm is employed as the necessary and sufficient value.

The present inventors have produced heat radiation members each having a laminated structure including a metal material and a carbon material bonded to each other by using various carbon materials, and have investigated the change behavior of the thermal conductivity (i.e., the thermal conductivity or the thermal resistance) under application of heat cycles. As a result, it has been found that the use of the material having a gas permeability with a nitrogen gas flow rate permeating a plate thickness of 11 mm under a pressure of 200 kPa per a pressurizing area of 0.01 m² of 5 L/min or more as shown in the property (A) as the carbon material bonded to the metal material is significantly effective for retaining the thermal conductivity under application of heat cycles.

It has been found from the observation of the bonding interface between the metal material and the carbon material after the heat cycle test that in the heat radiation member using the carbon material having the aforementioned gas permeability, the occurrence of bonding failure, such as voids and exfoliation, is significantly suppressed. It is considered that the carbon material having the aforementioned gas permeability and the metal material can be tightly bonded, and thereby the durability of the bonding interface against the thermal stress due to repeated heating and cooling is largely enhanced. As a result, the high thermal conductivity at the bonding interface can be retained after application of heat cycles.

Carbon materials vary in gas permeability depending on the void structure thereof even though the bulk density is constant. A carbon material has in the interior thereof closed voids and voids constituting continuous pores, and in general, it is considered that a void structure having a large amount of continuous pores has high gas permeability. With a void structure having certainly high gas permeability, the anchoring effect due to the impregnation of a metal material or a brazing material is exerted, and a high bonding strength is obtained between the metal material and the carbon material. The nitrogen gas flow rate permeating a plate thickness of 11 mm under a pressure of 200 kPa per a pressurizing area of 0.01 m², which is an index showing the gas permeability of the carbon material, is preferably 5 L/min or more, and more preferably 10 L/min or more.

However, a carbon material having higher gas permeability is not necessarily advantageous to the durability of the bonding interface after application of heat cycles. With too high gas permeability, in the case where a measure for sufficiently removing gas component, such as oxygen, remaining in the voids in bonding to the metal material is not performed, the remaining gas components may become a factor generating voids at the bonding interface. Furthermore, a carbon sintered article or the like having excessively high gas permeability may be disadvantageous to the durability under application of heat cycles due to the low strength thereof. As a result of the various investigations, the present invention uses a carbon material having a nitrogen gas flow rate permeating a plate thickness of 11 mm under a pressure of 200 kPa per a pressurizing area of 0.01 m² of 30 L/min or less. It may be managed to use a carbon material having a nitrogen gas flow rate of 25 L/min or less. Porous carbon and a porous sintered article of carbon, which is used in the background art literature, each have a measured nitrogen gas flow rate permeating a plate thickness of 11 mm under a pressure of 200 kPa per a pressurizing area of 0.01 m² that largely exceeds 30 L/min, and thus cannot be applied to the present invention.

The carbon material applied to the present invention preferably has high strength. For example, the carbon material preferably has a bending strength of 40 MPa or more, more preferably 45 MPa or more, and further preferably 48 MPa or more. The bending strength used herein may be a three-point bending strength measured according to JIS R7222:1017. A specimen applied to the measurement of the bending strength may be a square timber specimen of 20 mm×20 mm×100 mm. The use of the carbon material having high strength is advantageous for securing the excellent durability of the bonding interface to the metal material. Furthermore, the carbon material having high strength is preferably used in the case of constituting the heat radiation member with the metal materials holding the carbon material therebetween that are separated from each other. In the case where the carbon material is thin, or the metal material to be bonded thereto is thin, the bending strength of the carbon material is preferably 55 MPa or more, and more preferably 60 MPa or more, for securing the strength of the heat radiation member. The bulk density of the carbon material is more preferably 1.80 to 1.90 g/cm³.

Examples of the industrial product that is preferred as the carbon material applied to the present invention include a CIP (cold isostatic press) molded graphitized material, which is isotropic graphite produced by the production method of molding a graphite raw material by CIP, followed by graphitizing. The CIP molded graphitized material is isotropic in thermal conductivity and mechanical characteristics, and is a material that achieves the gas permeability defined in the present invention and can achieve the strength level with a bending strength of 40 MPa or more.

The characteristics of the carbon material, such as the gas permeability, the bending strength, and the bulk density, are ascribed to the structure thereof depending on the various production conditions including the particle diameter of the carbon raw material, the auxiliary agent mixed, and the like.

A smaller thickness of the carbon material is advantageous to the thermal conductivity, but with a too small thickness, the handling property of the carbon material deteriorates, and the carbon material becomes breakable in molten metal bonding or brazing. A too large thickness thereof is disadvantageous to the size reduction of the heat radiation member. As a result of the various investigations, the thickness of the carbon material applied to the present invention is preferably 0.1 to 5 mm, more preferably 0.5 to 4 mm, and further preferably 1 to 3 mm. Examples of the specific form of the carbon material constituting the heat radiation member of the present invention include a plate material formed of the carbon material having the aforementioned property (i.e., a carbon plate). For example, a plate material cut out from a product of the carbon material having the aforementioned property (such as a graphite block product) may be used. A plate material that is obtained by further thinning through grinding with a milling machine or the like is also encompassed in the aforementioned cut out plate material.

[Metal Material]

The metal material that is bonded to the carbon material to constitute the heat radiation member according to the present invention is preferably any of aluminum, an aluminum alloy, copper, and a copper alloy having excellent thermal conductivity.

Examples of the aluminum based material include pure aluminum (purity: 99.9% or more), an alloy No. A1050 (purity: 99.5% or more), an Al-0.4S1-0.05B alloy, an Al-0.05Mg-0.04Si alloy, an Al-0.08Mg-0.06Si alloy, an Al-0.1Zr alloy, an Al-0.2Zr alloy, an Al-0.1Zn alloy, and an Al-0.2Zn alloy.

Preferable examples of the copper based material include pure copper based material such as an alloy No. C1020 (oxygen-free copper) and an alloy No. C1100 (tough pitch copper).

The metal material particularly preferably has characteristics with a thermal conductivity of 170 W/(m·K) or more and a 0.2% proof stress of 40 MPa or less.

[Bonding Structure of Metal Material and Carbon Material]

Any of the following bonding structures (i) and (ii) is effectively used for achieving the tight bonding structure excellent in durability between the metal material and the carbon material having the aforementioned gas permeability.

(i) A molten metal of the metal material is solidified while contacting with the surface of the carbon material to form the bonding structure.

(ii) The metal material and the carbon material are bonded based on the principle of brazing to foist the bonding structure.

Both the bonding structures are formed through solidification of the molten metal on the surface of the carbon material. The microscopic contact area between the metal and the carbon material is increased in contacting the molten metal with the surface of the carbon material, so as to achieve an excellent anchoring effect. However, for securing the excellent durability under application of heat cycles, it is necessary to use the combination with the carbon material having the prescribed gas permeability as described above.

[Production Method]

The heat radiation member having the bonding structure (i) can be produced by a "molten metal bonding method", and the heat radiation member having the bonding structure (ii) can be produced by a "brazing method". Examples of these methods are shown below.

[Molten Metal Bonding Method (1)]

FIG. 3 schematically shows the cross section of a cast mold formed of carbon for producing the "heat radiation base" having the laminated structure including the metal material and the carbon material bonded to each other by the molten metal bonding method. The carbon material 10 in a plate form is retained inside a cast mold 1 formed of carbon having a combination of an upper cast mold member 1a and a lower cast mold member 1b. For retaining the carbon material 10 in a plate form in the inner space of the cast mold 1, for example, it suffices that a cutout step is provided on a partial region of each of contact surfaces of the upper cast mold member 1a and the lower cast mold member 1b in such a manner that a channel having a width corresponding to the thickness of the carbon material 10 is formed inside the cast mold 1 in bringing the upper and lower cast mold members into contact with each other, and the carbon material 10 is held with the cutout steps of the upper and lower cast mold members. In the example shown in FIG. 3, the carbon material 10 is held with the contact part of the upper cast mold member 1a and the lower cast mold member 1b, which are disposed in the back side and the front side in the projection direction (i.e., the y axis direction) of the cross sectional view.

The cast mold 1 is placed in a heating furnace, and heated in an atmosphere of a non-oxidative gas, such as nitrogen gas, and a molten metal of the metal material melted with a melting furnace, which is not shown in the figure, is charged in the cast mold 1 through a sprue port 4 of a lid member 3 provided on the upper cast mold member 1a. At this time, the molten metal to be charged is preferably a molten metal, from which an oxide film on the surface thereof has been removed. For example, the molten metal supplied from the melting furnace is preferably charged while preforming an oxide film removing treatment. In the case of a molten metal of an aluminum based metal, the oxide film removing treatment may be effectively a method of charging the molten metal while removing the oxide film on the surface of the molten metal by passing the molten metal through a minute nozzle. Molten metal 2 stored in a molten metal storage 51 in the cast mold 1 is transferred to a molten metal supplying path 52, and then the molten metal 2 is taken to the apical portion of the surrounding space of the carbon material 10 (i.e., the left end in the x axis direction in FIG. 3). The molten metal 2 is directionally solidified from the apical portion by bringing a water-cooled copper block into contact with the outer wall of the cast mold at the apical portion to remove heat. At this time, for taking the molten metal 2 to the apical portion of the cast mold without gap, and for preventing a shrinkage cavity from being formed due to the solidification shrinkage of the metal, the molten metal 2 is charged and solidified under pressurization with an inert gas, such as nitrogen gas, at a pressure, for example, of 30 to 200 kPa from the sprue port 4.

The molten metal 2 is solidified while sufficiently brought into contact with the surface of the carbon material 10, and thus tight bonding is achieved at the interface between the metal material formed through solidification of the molten metal 2 and the carbon material 10. The molten metal 2 is completely solidified throughout all the regions in the cast mold and then cooled to ordinary temperature, and the solidified material having the carbon material 10 embedded therein is taken out by disassembling the cast mold 1 formed of carbon. The parts of the solidified molten metal 2 remaining in the molten metal storage 51 and the molten metal supplying path 52 are cut out from the solidified material. Furthermore, the edges of the carbon material 10 protruding from the metal material at the part held with the upper and lower cast mold members are also cut out and removed. The heat radiation base having the laminated structure 100 shown in FIG. 1 can be obtained in this manner. The heat radiation base may be polished depending on necessity for smoothing the surface of the metal material or removing attachments derived from the cast mold.

[Molten Metal Bonding Method (2)]

FIG. 4 schematically shows the cross section of a cast mold formed of carbon for producing the "base-integrated insulated circuit board" having the laminated structure including the metal material and the carbon material bonded to each other by the molten metal bonding method. The carbon material 10 in a plate form and the ceramic material 30 in a plate form are retained inside a cast mold 1 formed of carbon having a combination of the upper cast mold member 1a and the lower cast mold member 1b. The carbon material 10 in a plate form can be retained in the cast mold 1 by the same method as in FIG. 3, i.e., the method of holding with the upper and lower cast mold members. In the examples in FIG. 4, also, the carbon material 10 is held with the contact part of the upper cast mold member 1a and the lower cast mold member 1b, which are disposed in the back side and the front side in the projection direction (i.e., the y axis direction) of the cross sectional view. For retaining the ceramic material 30 in a plate form at the prescribed height in the cast mold 1, for example, such a method may be used that pedestals (which are not shown in the figure) supporting the edges of the ceramic material 30 on which the circuit metal material is not formed, so as to bind the ceramic material 30 for preventing the movement thereof in the horizontal direction are provided on the bottom of the lower cast mold member 1b, and the ceramic material 30 is disposed on the pedestals. In this case, a gap corresponding to the thickness of the circuit metal material connecting to the molten metal supplying path 52 is formed between the bottom of the lower cast mold member 1b and the ceramic material 30. In the example in FIG. 4, the pedestals are disposed on the back side and the front side in the projection direction (i.e., the y axis direction) of the cross sectional view.

The cast mold 1 is placed in a heating furnace, and heated in an atmosphere of a non-oxidative gas, such as nitrogen gas, and a molten metal of the metal material melted with a melting furnace, which is not shown in the figure, is charged in the cast mold 1 through the sprue port 4 of the lid member 3 provided on the upper cast mold member 1a. At this time, the molten metal to be charged is preferably a molten metal, from which an oxide film on the surface thereof has been removed. For example, the molten metal supplied from the melting furnace is preferably charged while preforming the aforementioned oxide film removing treatment. The molten metal 2 stored in the molten metal storage 51 in the cast mold 1 is transferred to the molten metal supplying path 52, and then the molten metal 2 is taken to the apical portion of the surrounding space of the carbon material 10 and the ceramic material 30 (i.e., the left end in the x axis direction in FIG. 4). The molten metal 2 is directionally solidified from the apical portion by bringing a water-cooled copper block into contact with the outer wall of the cast mold at the apical portion to remove heat. At this time, for taking the molten metal 2 to the apical portion of the cast mold without gap, and for preventing a shrinkage cavity from being formed due to the solidification shrinkage of the metal, the molten metal 2 is charged and solidified under pressurization with an inert gas, such as nitrogen gas, at a pressure, for example, of 30 to 200 kPa from the sprue port 4.

As similar to the case in FIG. 3, tight bonding is achieved at the interface between the metal material formed through solidification of the molten metal 2 and the carbon material 10. Furthermore, the bonding strength at the interface between the metal material formed through solidification of the molten metal 2 and the ceramic material 30 is also sufficiently secured. The molten metal 2 is completely solidified throughout all the regions in the cast mold and then cooled to ordinary temperature, and the solidified material having the carbon material 10 and the ceramic material 30 embedded therein is taken out by disassembling the cast mold 1 formed of carbon. The parts of the solidified molten metal 2 remaining in the molten metal storage 51 and the molten metal supplying path 52 are cut out from the solidified material. Furthermore, the edges of the carbon material 10 protruding from the metal material at the part held with the upper and lower cast mold members are also cut out and removed. After polishing the surfaces of the metal material and the circuit metal material depending on necessity, a part of the metal material on the surface of the ceramic material 30 is dissolved and removed by masking the prescribed region and then spraying an etching solution, such as iron chloride, for the purpose of removing the unnecessary metal covering the portion around the edge of the ceramic material 30, and the purpose of forming a circuit pattern on the surface of the ceramic material 30 opposite to the carbon material 10. The base-integrated insulated circuit board having the laminated structure 300 shown in FIG. 2 can be obtained in this manner. Thereafter, the surface of the base-integrated insulated circuit board may be subjected to plating, such as Ni electroplating, Ni—P electroless plating, and Au electroless plating, as necessary.

As shown in FIG. 5, cavities 53 for forming fins may be provided in the upper cast mold member 1a, and thereby a type of a base-integrated insulated circuit board having a heatsink with heat radiation fins bonded directly to the carbon material 10 can be provided.

[Brazing Method]

In the brazing method, the metal material and the carbon material are bonded to each other in such a manner that a laminate including the metal material and the carbon material laminated via a brazing material component is heated to a temperature equal to or lower than the melting point of the metal material under application of a prescribed pressure to the lamination interface, so as to melt the surface of the metal material near the lamination interface, along with the brazing material component. In brazing, generally, a filler material having been regulated in advance to have a low melting point alloy composition, such as a eutectic composition, is frequently used as a brazing material. However, aluminum and copper tend to form a binary alloy having a low melting point, and thus in the present invention, which is satisfied by planar bonding, such a method is preferred that no filler material is used, and the element forming the low melting point binary alloy is diffused from the surface of the metal material, so as to lower the melting point around the surface. In this case, what functions as the "brazing material" is the low melting point alloy formed around the surface, but not the filler material.

FIG. 6 shows the cross section of the laminate in the case where the metal material and the carbon material constituting the heat radiation base are bonded by the brazing method. Plural laminates 101 each include the metal materials 21 and 22 disposed on the upper and lower sides of the carbon material 10 are laminated with spacers 5 formed of a refractory material, such as ceramics and a carbon material, intervening therebetween. While two laminates 101 are laminated in FIG. 6, plural laminates 101 may be further laminated on the uppermost spacer 5. On the surfaces of the metal materials 21 and 22 that are to be brought into contact with the carbon material, a film of the brazing material component element is attached in advance by a sputtering method or the like. The film of the brazing material component intervenes at the "metal-carbon interface" shown by the symbol A in FIG. 6. The brazing material component element is preferably Si, Cu, Ag, Ge, or the like in the case where the metal materials 21 and 22 are the aluminum based metal, and is preferably P, Ag, Sn, or the like for the copper based metal. The laminate is placed in a vacuum furnace, which is then evacuated, the laminate is heated and retained at a predetermined temperature lower than the melting point of the metal material 21 and 22 under application of a load in the lamination direction (i.e., the z axis direction shown in FIG. 6), so as to diffuse the brazing material component element into the metal materials 21 and 22. After forming the alloy of the component element of the metal materials 21 and 22 (i.e., Al or Cu) and the brazing material component element around the lamination interface through the progress of the diffusion, the liquidus line temperature around the surfaces of the metal materials 21 and 22 is decreased corresponding to the change of the alloy composition, and a molten metal phase is formed at the lamination interface (i.e., the metal-carbon interface). The molten metal phase is solidified while sufficiently brought into contact with the surface of the carbon material 10, and thus tight bonding is achieved at the interfaces between the metal materials 21 and 22 and the carbon material 10.

The laminate 101 obtained by brazing can be used as the heat radiation member constituting the heat radiation base 100 shown in FIG. 1. In the case where the bonding between the heat radiation base 100 and the insulated circuit board 200 shown in FIG. 1 is changed from the bonding with the bonding metal layer 50 to the bonding by the brazing method using the sputtered film of the brazing material component element as described above, the brazing of the "metal-carbon interface" for forming the heat radiation base 100 and the brazing of the "metal-metal interface" for bonding the heat radiation base 100 and the insulated circuit board 200 may be performed simultaneously.

EXAMPLES

[Gas Permeability Test of Carbon Material]

The carbon materials (all of which were CIP molded graphitized materials) shown in Table 1 were prepared. The carbon material No. C1 was MC4422, No. C2 was MC4415, No. C3 was MC4423, No. C4 was MC4416, No. C5 was MC4319, No. C6 was MC4509, and No. C7 was MC4313, all trade names, produced by Mechanical Carbon Industry Co., Ltd. The carbon materials were measured for gas permeability in the following manner.

portion was sealed. Pressurization was performed at a predetermined pressure by introducing nitrogen gas at ordinary temperature from a gas introduction port 71 provided at the center of the gas introduction side plate 61. At this time, the flow rate V (L/min) of the nitrogen gas that permeated the interior of the carbon material 10 having a thickness of 11 mm from the surface of the carbon material 10 inside the inner periphery O-ring 8, and was discharged from a gas discharge port 72 provided at the center of the gas discharge side plate 62 was measured. The gas permeation amount X (L/min) per 0.01 $m^2$ in terms of area of the pressurized principal surface was obtained according to the following expression (1).

$$X = 0.01 V/S \qquad (1)$$

In the expression, S represents the area ($m^2$) inside the inner periphery O-ring 8. For securing the measurement accuracy, S was 0.005 $m^2$ or more.

Herein, the carbon material specimen for the evaluation of the gas permeability was a plate material having a size of 98 mm×127 mm×11 mm, and the area S inside the inner periphery O-ring 8 was 0.006 $m^2$. The pressure for pressurization with nitrogen gas was set to four levels, i.e., 50 kPa, 100 kPa, 150 kPa, and 200 kPa, and the measurement was performed at room temperature (23° C.). The results are shown in Table 1. The specimen that showed a gas permeation amount X of 5 L/min or more and 30 L/min or less at a pressure for pressurization of 200 kPa was designated as the "invention material".

TABLE 1

| | | Class | | | | | | |
|---|---|---|---|---|---|---|---|---|
| Carbon material No. | | Invention material C1 | Invention material C2 | Invention material C3 | Invention material C4 | Invention material C5 | Comparative material C6 | Invention material C7 |
| Bulk density (g/cm³) | | 1.82 | 1.84 | 1.84 | 1.86 | 1.85 | 1.88 | 1.85 |
| Bending strength (MPa) | | 54.9 | 58.8 | 65.0 | 76.0 | 43.1 | 93.0 | 49.0 |
| Thermal conductivity (W/m · K) | | 106 | 114 | 105 | 102 | 83 | 93 | 118 |
| Ash content (%) | | 0.04 | 0.03 | 0.04 | 0.04 | 0.05 | 0.04 | 0.05 |
| | | Gas permeation amount X (L/min) (note 1) | | | | | | |
| Pressure of nitrogen gas for pressurization (kPa) | 50 | 2.0 | 2.0 | 1.8 | 0.0 | 0.0 | 0.0 | 3.3 |
| | 100 | 6.0 | 6.2 | 5.7 | 4.2 | 4.2 | 0.0 | 9.3 |
| | 150 | 10.8 | 11.2 | 10.3 | 8.0 | 8.0 | 0.0 | 15.3 |
| | 200 | 15.7 | 15.8 | 14.8 | 12.0 | 12.0 | 0.0 | 22.5 |

(note 1):
nitrogen gas flow rate permeating a plate thickness of 11 mm per 0.01 $m^2$ in terms of pressurized area FIG. 7 schematically shows a cross section of a jig for binding the carbon material in the measurement of the gas permeability of the carbon material. The jig was constituted by a gas introduction side plate 61 and a gas discharge side plate 62 formed of a stainless steel. The carbon material 10 in a plate form having a thickness of 11 mm as a measurement specimen was disposed in the depressed portion provided on the gas introduction side plate 61, and the gas introduction side plate 61 and the gas discharge side plate 62 were clamped with plural bolts not shown in the figure. The carbon material 10 was bound by pressing one principal surface of the carbon material 10 with an inner periphery O-ring 8 attached to the wall surface of the depressed portion of the gas introduction side plate 61. The gas introduction side plate 61 and the gas discharge side plate 62 were brought into contact with each other via an outer periphery O-ring 9, with which the inner space of the depressed Plate materials of the carbon material having thicknesses of 1.0 mm and 2.0 mm were produced from the block of each of the carbon materials with a milling machine. Heat radiation members were produced with the plate materials and investigated for the durability under application of heat cycles. The test results are exemplified below.

(1) Test for Heat Radiation Base Alone Obtained by Molten Metal Bonding Method

A heat radiation base having a laminated structure including an aluminum based materials bonded to both surfaces of a plate material of a carbon material was produced with a cast mold formed of carbon having the cross sectional structure shown in FIG. 3 according to the method described in the section (1) "Molten Metal Bonding Method" above. Herein, the aluminum based material was pure aluminum having a purity of 99.9% or more. The pressure of nitrogen gas pressurizing the molten metal was approximately 100 kPa. The edges of the carbon material protruding from the metal material were cut out and removed, and the surface thereof was mechanically polished. The resulting heat radiation base had a size of 70 mm×70 mm×t (wherein t represents the thickness), the metal materials holding the carbon material from both sides thereof were separated from each other, and the area ratio of the region where the carbon material existed occupied in the region where the metal materials holding the carbon material therebetween overlapped each other in the projected area viewed in the laminated direction was 100%. The kind of the carbon material used (No. of the carbon material shown in Table 1) and the thicknesses of the layers constituting the heat radiation base are shown in Table 2. Through holes having a diameter of 6 mm were formed at the four corners of the heat radiation base through machine processing, and the surface of the heat radiation base was subjected to Ni—P electroless plating (medium phosphorus type, plated film thickness: 5 μm), so as to produce a heat radiation base product corresponding to each of the heat radiation members (test specimens) of examples Nos. 1 to 8 in Table 2.

FIG. 8 schematically shows the cross sectional structure including the through holes of the resulting heat radiation base product. In the figure, the symbol 80 denotes the through hole, the symbol 81 denotes the plated layer, and the symbols M1, C, and M2 correspond the layers shown in Table 2 respectively. The thicknesses of the layers and the thickness of the plated layer in the lamination direction (i.e., the z axis direction) are exaggerated (which is the same as in FIGS. 9 to 11 described later).

The test specimens formed of the heat radiation base products were subjected to the following heat cycle test.
(Heat Cycle Test Method)

The heat radiation member as the test specimen was placed in a heat cycle test tank and subjected to 1,000 cycles of a heat cycle test in the air atmosphere. One cycle of the heat pattern was as follows.

One cycle of heat pattern: −40° C. retained for 30 minutes->25° C. retained for 10 minutes->150° C. retained for 30 minutes->25° C. retained for 10 minutes The heat radiation bases after the electroless plating and the heat radiation base products after 1,000 cycles of the heat cycle test were measured for the thermal conductivity in the following manner.
(Measurement Method of Thermal Conductivity)

Figure 12B:
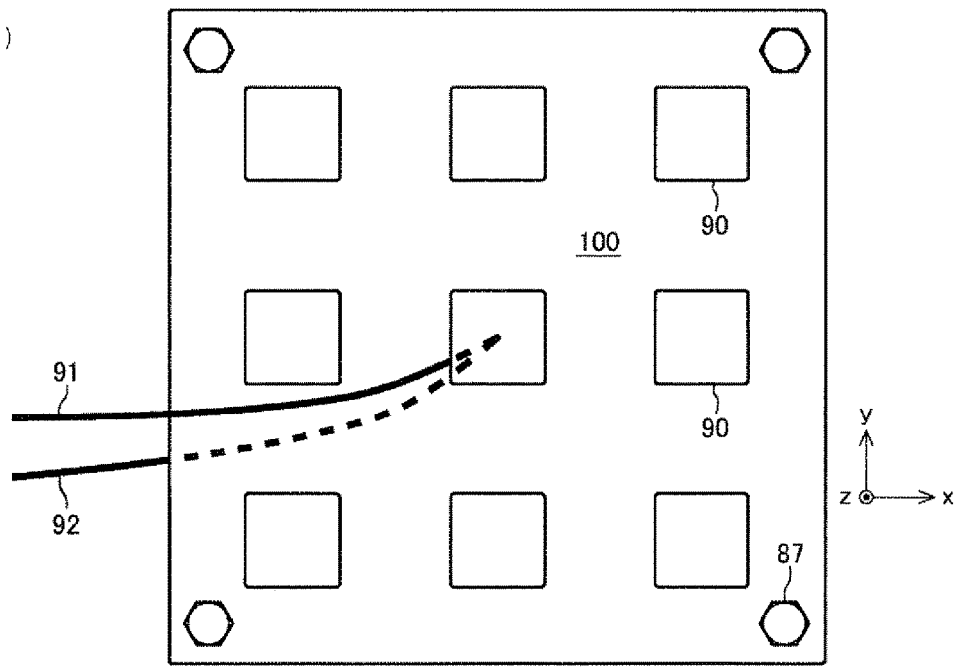

As shown in FIG. 12A, microheaters 90 as a heat generator were attached to the upper surface of the heat radiation base 100 including the carbon material 10 via silver-containing thermal conductive grease 85 having a thermal conductivity of 20 W/m·K. FIG. 12B is a plane view of the region of the heat radiation base 100 viewed from the side of the microheaters 90 attached (i.e., the surface of the metal material 21). The surface of the heat radiation base 100 having the microheaters 90 attached thereon had a size of 70 mm×70 mm, the microheaters each had a size of 10 mm×10 mm×1.5 mm, and nine microheaters were attached with an even distance of 13 mm. A water-cooled copper jacket 400 of 200 mm×200 mm×20 mm was mounted on the back surface of the heat radiation base 100 opposite to the surface having the microheaters 90 attached thereto (i.e., the side of the metal material 22), with bolts 87 at the four corners via silver-containing thermal conductive grease 86 having a thermal conductivity of 20 W/m·K. The thermal conductive grease 85 and 86 each had a layer thickness of approximately 0.5 mm. On the surfaces on both sides of the heat radiation base 100, metal wires of sheath thermocouples 91 and 92 each having an outer diameter of 0.5 mm exposed from a tip end of the sheath were adhered at the position immediately beneath the center of the center microheater (which was the surface of the metal material 21) and the back side position thereof in the z axis direction (which was the surface of the metal material 22) respectively with Kapton (registered trademark) tape, and the sheath thermocouples 91 and 92 were withdrawn outside through layers of the thermal conductive grease 85 and 86 respectively. The sheath thermocouples each were T type, Class 1. An electric current of 100 V and 0.5 A was supplied to each of the microheaters with a direct current stabilized power supply, so as to generate heat at an output of 50 W (i.e., the total output of nine microheaters was 450 W). Water regulated to have a temperature 15° C.±0.2° C. with a temperature controller using a chiller was allowed to follow in the water-cooled copper jacket 400 at a flow rate of 5 L/min. After the measured temperatures of the sheath thermocouples 91 and 92 were in the steady state, the measured temperatures were recorded as the heat generation side surface temperature T1 (° C.) and the heat radiation side surface temperature T2 (° C.) respectively. The thermal conductivity TC (W/m·K) of the heat radiation base in the lamination direction was obtained according to the following expression (2).

$$TC(W/m \cdot K) = ((\text{total heat generation amount of heaters: 450 W})/(\text{total area of heaters: 0.0009 m}^2)) \times ((\text{thickness of heat radiation base (m)})/(T1(° C.) - T2(° C.))) \quad (2)$$

In FIG. 12A, the thicknesses of the layers in the z axis direction are exaggerated, and the plated layers are omitted.

The results are shown in Table 2. The specimen having a smaller change in thermal conductivity between the initial stage (before the test) and after 1,000 cycles of the heat cycle test can be evaluated as having excellent durability.
(2) Test for Heat Radiation Base Alone Obtained by Brazing Method A heat radiation base having a laminated structure including plate materials of pure aluminum (purity: 99.9% or more) bonded to both surfaces of a plate material of a carbon material was produced by the method of FIG. 6 shown in the section "Brazing Method" above. The aluminum plates holding the carbon material therebetween were the same material. A film of a brazing material component element (Si) was formed in advance on each of the surfaces of the aluminum plates to be bonded to the carbon material. The amount of the brazing material component element attached was approximately 0.5 mg/cm². The laminate was heated and retained at 640° C. for minutes under reduced pressure of $10^{-5}$ Pa under application of a uniform load in the lamination direction (i.e., the z axis direction shown in FIG. 6) providing a surface pressure at the lamination interface of 2 MPa, followed by gradually cooling. The resulting heat radiation base had a size of 70 mm×70 mm×t (wherein t represents the thickness), the metal materials holding the carbon material from both sides thereof were separated from each other, and the area ratio of the region where the carbon material existed occupied in the region where the metal materials holding the carbon material therebetween overlapped each other in the projected area viewed in the laminated direction was 100%. The kind of the carbon material used (No. of the carbon material shown in Table 1) and the thicknesses of the layers constituting the heat radiation base are shown in Table 2. Through holes having a diameter of 6 mm were formed at the four corners of the heat radiation base through machine processing, and the surface of the heat radiation base was subjected to Ni—P electroless plating (medium phosphorus type, plated film thickness: 5 μm), so as to produce a heat radiation base product corresponding to each of the heat radiation members (test specimens) of examples Nos. 9 and 10 in Table 2. The component elements of the brazing material used are shown in Table 2. The cross sectional structure of the resulting heat radiation base product was the same as in the section (1) above (see FIG. 8).

The heat radiation members (specimens) formed of the heat radiation base products were subjected to the heat cycle test in the same manner as in the section (1) above, and the change in thermal conductivity between before and after the heat cycle test was measured. The results are shown in Table 2.

the section (1) "Molten Metal Bonding Method" above except that the AlN board was used instead of the carbon material. The surface of aluminum of the resulting laminated structure was polished, and then for the purpose of forming a circuit pattern (i.e., a circuit metal plate) and a heat radiation metal plate, the prescribed portion was masked, and then an etching solution of iron chloride was sprayed to dissolve and remove a part of aluminum on the surface of the AlN board, followed by subjecting the surface of aluminum to Ni—P electroless plating. An "aluminum bonded ceramic circuit board" having a structure including the AlN board having a size of 50 mm×50 mm×0.635 mm having bonded

TABLE 2

| | | Heat radiation base (specimen) | | | | | Thermal conductivity | | |
| --- | --- | --- | --- | --- | --- | --- | --- | --- | --- |
| | | Carbon material | | | | | | | |
| | | | | Gas | | | | | |
| Class | Example No. | No. | Thickness (mm) | permeation amount X (note 1) (L/min) | Metal material | Bonding method of carbon and metal | Thicknesses of layers M1/C/M2 (mm) | Initial stage a (W/m · K) | After heat cycle test b (W/m · K) | Change rate 100[(a − b)/a] (%) |
| Example | 1 | C1 | 1 | 15.7 | pure Al (≥99.9%) | molten metal bonding method | 1/1/1 | 165.6 | 165.5 | 0.1 |
| Example | 2 | C4 | 1 | 12.0 | pure Al (≥99.9%) | molten metal bonding method | 1/1/1 | 161.5 | 161.0 | 0.3 |
| Comparative Example | 3 | C6 | 1 | 0.0 | pure Al (≥99.9%) | molten metal bonding method | 1/1/1 | 150.1 | 92.1 | 38.6 |
| Example | 4 | C7 | 1 | 22.5 | pure Al (≥99.9%) | molten metal bonding method | 1/1/1 | 175.0 | 174.8 | 0.1 |
| Comparative Example | 5 | C6 | 2 | 0.0 | pure Al (≥99.9%) | molten metal bonding method | 1/2/1 | 130.2 | 92.3 | 29.1 |
| Example | 6 | C7 | 2 | 22.5 | pure Al (≥99.9%) | molten metal bonding method | 1/2/1 | 156.2 | 155.5 | 0.4 |
| Comparative Example | 7 | C6 | 1 | 0.0 | pure Al (≥99.9%) | molten metal bonding method | 1.5/1/1.5 | 164.3 | 108.3 | 34.1 |
| Example | 8 | C7 | 1 | 22.5 | pure Al (≥99.9%) | molten metal bonding method | 1.5/1/1.5 | 186.1 | 185.7 | 0.2 |
| Comparative Example | 9 | C6 | 2 | 0.0 | pure Al (≥99.9%) | brazing method (Si) | 1/2/1 | 130.2 | 80.1 | 38.5 |
| Example | 10 | C7 | 2 | 22.5 | pure Al (≥99.9%) | brazing method (Si) | 1/2/1 | 155.8 | 155.7 | 0.1 |

(note 1):
nitrogen gas flow rate permeating a plate thickness of 11 mm under pressure of 200 kPa per 0.01 m² in terms of pressurized area It was understood from Table 2 that the specimens of the examples according to the present invention showed a significantly small change in thermal conductivity between before and after the heat cycle test, and thus had excellent durability. On the other hand, the specimens of the comparative examples had a thermal conductivity that was largely decreased due to the application of heat cycles. It was confirmed that the decrease of the thermal conductivity was caused by the exfoliation of the "metal-carbon bonding interface".

(3) Test for Heat Radiation Member Including Heat Radiation Base Obtained by Molten Metal Bonding Method and Aluminum Bonded Ceramic Circuit Board Ceramic Circuit Board An aluminum bonded ceramic circuit board was produced in a following manner.
(Production Method for Aluminum Bonded Ceramic Circuit Board)

An AlN board having a size of 50 mm×50 mm×0.635 mm was prepared. A laminated structure including plates of pure aluminum (purity: 99.9% or more) bonded to both surfaces of the AlN board was produced by the method described in on both surfaces thereof the aluminum plates having a size of 48 mm×48 mm×0.4 mm was produced in this manner.

A heat radiation base product produced by applying the aluminum based metal material shown in Table 3 in the same manner as in the section (1) above and the aluminum bonded ceramic circuit board produced above were bonded to each other in a nitrogen atmosphere by silver sintering or by soldering with lead-free solder (Sn-3Ag-0.5Cu), so as to provide heat radiation members (test specimens) of examples Nos. 21, 22, and 24 to 33 in Table 3. For comparison, a heat radiation base formed of an aluminum single plate having a plate thickness of 4 mm using no carbon material and the aluminum bonded ceramic circuit board were bonded to each other in a nitrogen atmosphere by silver sintering, so as to provide a heat radiation member (test specimen) of example No. 23 in Table 3. The heat radiation base product subjected to silver sintering was subjected to Au electroless plating in addition to the Ni—P electroless plating.

FIG. 9 schematically shows the cross sectional structure of the resulting heat radiation member (test specimen). The cross section of the heat radiation base is shown with the through holes 80 included. The symbols M1, AlN, M2, B, M3, C, and M4 correspond to the layers shown in Table 3 respectively. The symbol 50 denotes the bonding metal layer (i.e., the layer derived from silver sintering or the solder layer).

The heat radiation members (specimens) were subjected to the heat cycle test in the same manner as in the section (1) above, and the change in thermal resistance (between the M1 surface and the M4 surface) between before and after the heat cycle test was measured. The thermal resistance was measured in the following manner for the heat radiation member before and after the heat cycle test.

(Measurement Method of Thermal Resistance)

Figure 13A:
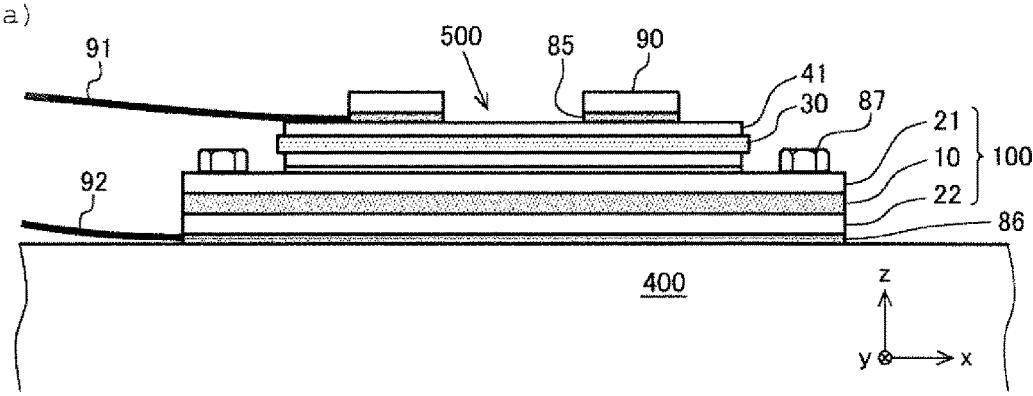
FIGS. 13A and 13B are a side view and a plane view respectively for explaining a thermal resistance measurement method of the specimen.
Figure 13B:
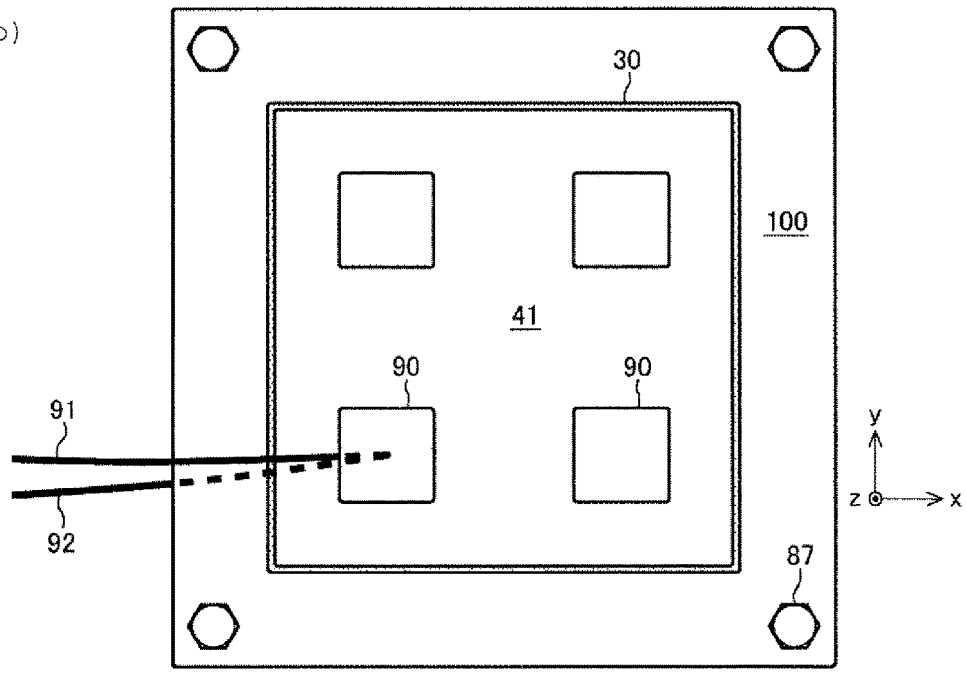

As shown in FIG. 13A, the microheaters 90 as a heat generator were attached to the upper surface of the test specimen 500 (which was the laminated structure denoted by the symbols 22 to 41 in the example shown in this figure) as the heat radiation member via the silver-containing thermal conductive grease 85 having a thermal conductivity of 20 W/m·K. FIG. 13B is a plane view of the region of the test specimen 500 viewed from the side of the microheaters 90 attached. The surface of the test specimen 500 having the microheaters 90 attached thereon (which was the surface of the circuit metal material 41 in the example shown in this figure) had a size of 48 mm×48 mm, the microheaters each had a size of 10 mm×10 mm×1.5 mm, and four microheaters were attached with an even distance of 15 mm. The water-cooled copper jacket 400 of 200 mm×200 mm×20 mm was mounted on the back surface of the test specimen 500 (which was the side of the metal material 22 in the example shown in this figure) opposite to the surface having the microheaters 90 attached thereto, with bolts 87 via the silver-containing thermal conductive grease 86 having a thermal conductivity of 20 W/m·K. The thermal conductive greases 85 and 86 each had a layer thickness of approximately 0.5 mm. On the surfaces on both upper and lower sides of the test specimen 500, metal wires of sheath thermocouples 91 and 92 each having an outer diameter of 0.5 mm exposed from a tip end of the sheath were adhered at the position immediately beneath of center of any one of the microheaters (which was the surface of the circuit metal material 41 in the example shown in this figure) and the back side position thereof in the z axis direction (which was the surface of the metal material 22 in the example shown in this figure) respectively with Kapton (registered trademark) tape, and the sheath thermocouples 91 and 92 were withdrawn outside through layers of the thermal conductive grease 85 and 86 respectively. The sheath thermocouples each were T type, Class 1. An electric current of 100 V and 0.5 A was supplied to each of the microheaters with a direct current stabilized power supply, so as to generate heat at an output of 50 W (i.e., the total output of four microheaters was 200 W). Water regulated to have a temperature 15° C.±0.2° C. with a temperature controller using a chiller was allowed to follow in the water-cooled copper jacket 400 at a flow rate of 5 L/min. After the measured temperatures of the sheath thermocouples 91 and 92 were in the steady state, the measured temperatures were recorded as the heat generation side surface temperature T1 (° C.) and the heat radiation side surface temperature T2 (° C.) respectively. The thermal resistance R (K/W) of the test specimen in the lamination direction was obtained according to the following expression (3).

$$R\ (K/W) = (T1(° C.) - T2(° C.))/(\text{total heat generation amount of heaters: } 200\ W) \quad (3)$$

In FIG. 13A, the thicknesses of the layers in the z axis direction are exaggerated, and the plated layers are omitted.

The results are shown in Table 3. The specimen having a smaller change in thermal resistance between the initial stage (before the test) and after 1,000 cycles of the heat cycle test can be evaluated as having excellent durability.

TABLE 3

| | | | | Heat radiation base | | | |
|---|---|---|---|---|---|---|---|
| | | | Carbon material | | | | |
| Class | Example No. | No. | Thickness (mm) | Gas permeation amount X (note 1) (L/min) | Metal material | Bonding method of carbon and metal | Bonding method of heat radiation base and aluminum bonded ceramic circuit board |
| Comparative Example | 21 | C6 | 2 | 0.0 | pure Al (≥99.9%) | molten metal bonding method | silver sintering |
| Example | 22 | C7 | 2 | 22.5 | pure Al (≥99.9%) | molten metal bonding method | silver sintering |
| Comparative Example | 23 | — | — | — | pure Al (≥99.9%) | — | silver sintering |
| Comparative example | 24 | C6 | 2 | 0.0 | Al—0.4Si—0.05B | molten metal bonding method | soldering |
| Example | 25 | C7 | 2 | 22.5 | Al—0.4Si—0.05B | molten metal bonding method | soldering |
| Comparative Example | 26 | C6 | 2 | 0.0 | Al—0.05Mg—0.04Si | molten metal bonding method | soldering |
| Example | 27 | C7 | 2 | 22.5 | Al—0.05Mg—0.04Si | molten metal bonding method | soldering |
| Comparative Example | 28 | C6 | 2 | 0.0 | Al—0.08Mg—0.06Si | molten metal bonding method | soldering |
| Example | 29 | C7 | 2 | 22.5 | Al—0.08Mg—0.06Si | molten metal bonding method | soldering |
| Comparative Example | 30 | C6 | 2 | 0.0 | Al—0.2Zr | molten metal bonding method | soldering |
| Example | 31 | C7 | 2 | 22.5 | Al—0.2Zr | molten metal bonding method | soldering |

TABLE 3-continued

| | | | | | | | |
|---|---|---|---|---|---|---|---|
| Comparative Example | 32 | C6 | 2 | 0.0 | Al—0.2Zn | molten metal bonding method | soldering |
| Example | 33 | C7 | 2 | 22.5 | Al—0.2Zn | molten metal bonding method | soldering |

| | | Test specimen | Thermal resistance | | |
|---|---|---|---|---|---|
| Class | Example No. | Thicknesses of layers M1/AlN/M2/B/M3/C/M4 (mm) | Initial stage a (K/W) | After heat cycle test b (K/W) | Change rate 100[(b − a)/a] (%) |
| Comparative Example | 21 | 0.4/0.635/0.4/0.05/1/2/1 | 0.228 | 0.314 | 37.7 |
| Example | 22 | 0.4/0.635/0.4/0.05/1/2/1 | 0.202 | 0.201 | −0.5 |
| Comparative Example | 23 | 0.4/0.635/0.4/0.05/—/—/4 | 0.161 | 0.239 | 48.4 |
| Comparative example | 24 | 0.4/0.635/0.4/0.2/1/2/1 | 0.262 | 0.366 | 39.7 |
| Example | 25 | 0.4/0.635/0.4/0.2/1/2/1 | 0.237 | 0.246 | 3.8 |
| Comparative Example | 26 | 0.4/0.635/0.4/0.2/1/2/1 | 0.259 | 0.363 | 40.2 |
| Example | 27 | 0.4/0.635/0.4/0.2/1/2/1 | 0.234 | 0.243 | 3.8 |
| Comparative Example | 28 | 0.4/0.635/0.4/0.2/1/2/1 | 0.262 | 0.366 | 39.7 |
| Example | 29 | 0.4/0.635/0.4/0.2/1/2/1 | 0.237 | 0.246 | 3.8 |
| Comparative Example | 30 | 0.4/0.635/0.4/0.2/1/2/1 | 0.265 | 0.369 | 39.2 |
| Example | 31 | 0.4/0.635/0.4/0.2/1/2/1 | 0.240 | 0.249 | 3.8 |
| Comparative Example | 32 | 0.4/0.635/0.4/0.2/1/2/1 | 0.265 | 0.369 | 39.2 |
| Example | 33 | 0.4/0.635/0.4/0.2/1/2/1 | 0.241 | 0.252 | 4.6 |

(note 1):
nitrogen gas flow rate permeating a plate thickness of 11 mm under pressure of 200 kPa per 0.01 m² in terms of pressurized area It was understood from Table 3 that the specimens of the examples according to the present invention showed a significantly small change in thermal resistance between before and after the heat cycle test, and thus had excellent durability. On the other hand, the specimens of the comparative examples had a thermal resistance that was largely increased due to the application of heat cycles. It was confirmed that the increase of the thermal resistance was caused by the exfoliation of the "metal-carbon bonding interface" or the cracks in the silver sintered layer or the solder layer. In No. 23 using no carbon material, the heat resistance was largely increased due to the exfoliation of the silver sintered layer.

(4) Test for Heat Radiation Member Including Heat Radiation Base Obtained by Brazing Method and Aluminum Bonded Ceramic Circuit Board A heat radiation base product produced in the same manner as in the section (2) above and an aluminum bonded ceramic circuit board produced in the same manner as in the section (3) were bonded to each other in a nitrogen atmosphere by soldering with lead-free solder, so as to provide heat radiation members (test specimens) of examples Nos. 34 to 47 in Table 4. In the production of the heat radiation base product, the heating and retaining temperature in brazing was 850° C. for the examples using the copper based metal material (Nos. 42 to 47). The component elements of the brazing material used are shown in Table 4. The cross sectional structure of the resulting heat radiation member (test specimen) was the same as in the section (3) above (see FIG. 9).

The heat radiation members (test specimens) were measured for the change in thermal resistance (between the M1 surface and the M4 surface) between before and after the heat cycle test in the same manner as in the section (3) above. The results are shown in Table 4.

TABLE 4

| | | Heat radiation base | | | | | |
|---|---|---|---|---|---|---|---|
| | | Carbon material | | | | | |
| Class | Example No. | No. | Thickness (mm) | Gas permeation amount X (note 1) (L/min) | Metal material | Bonding method of carbon and metal | Bonding method of heat radiation base and aluminum-clad ceramic circuit board |
| Comparative Example | 34 | C6 | 2 | 0.0 | pure Al (≥99.9%) | brazing method (Si) | soldering |
| Example | 35 | C7 | 2 | 22.5 | pure Al (≥99.9%) | brazing method (Si) | soldering |
| Comparative Example | 36 | C6 | 2 | 0.0 | pure Al (≥99.9%) | brazing method (Cu) | soldering |
| Example | 37 | C7 | 2 | 22.5 | pure Al (≥99.9%) | brazing method (Cu) | soldering |

TABLE 4-continued

| | Example No. | Class | | | | | |
|---|---|---|---|---|---|---|---|
| Comparative Example | 38 | C6 | 2 | 0.0 | pure Al (≥99.9%) | brazing method (Ag) | soldering |
| Example | 39 | C7 | 2 | 22.5 | pure Al (≥99.9%) | brazing method (Ag) | soldering |
| Comparative Example | 40 | C6 | 2 | 0.0 | pure Al (≥99.9%) | brazing method (Ge) | soldering |
| Example | 41 | C7 | 2 | 22.5 | pure Al (≥99.9%) | brazing method (Ge) | soldering |
| Comparative Example | 42 | C6 | 1 | 0.0 | Cu—0.07Fe—0.02P | brazing method (P) | soldering |
| Example | 43 | C7 | 1 | 22.5 | Cu—0.07Fe—0.02P | brazing method (P) | soldering |
| Comparative Example | 44 | C6 | 1 | 0.0 | Cu—0.07Fe—0.02P | brazing method (Ag) | soldering |
| Example | 45 | C7 | 1 | 22.5 | Cu—0.07Fe—0.02P | brazing method (Ag) | soldering |
| Comparative Example | 46 | C6 | 1 | 0.0 | Cu—0.07Fe—0.02P | brazing method (Sn) | soldering |
| Example | 47 | C7 | 1 | 22.5 | Cu—0.07Fe—0.02P | brazing method (Sn) | soldering |

| | | Test specimen | | Thermal resistance | | |
|---|---|---|---|---|---|---|
| Class | Example No. | Thicknesses of layers M1/AlN/M2/B/M3/C/M4 (mm) | | Initial stage a (K/W) | After heat cycle test b (K/W) | Change rate 100[(b − a)/a] (%) |
| Comparative Example | 34 | 0.4/0.635/0.4/0.2/1/2/1 | | 0.252 | 0.399 | 58.3 |
| Example | 35 | 0.4/0.635/0.4/0.2/1/2/1 | | 0.227 | 0.242 | 6.6 |
| Comparative Example | 36 | 0.4/0.635/0.4/0.2/1/2/1 | | 0.251 | 0.394 | 57.0 |
| Example | 37 | 0.4/0.635/0.4/0.2/1/2/1 | | 0.227 | 0.245 | 7.9 |
| Comparative Example | 38 | 0.4/0.635/0.4/0.2/1/2/1 | | 0.252 | 0.391 | 55.2 |
| Example | 39 | 0.4/0.635/0.4/0.2/1/2/1 | | 0.227 | 0.238 | 4.8 |
| Comparative Example | 40 | 0.4/0.635/0.4/0.2/1/2/1 | | 0.254 | 0.392 | 54.3 |
| Example | 41 | 0.4/0.635/0.4/0.2/1/2/1 | | 0.227 | 0.241 | 6.2 |
| Comparative Example | 42 | 0.4/0.635/0.4/0.2/1/1/1 | | 0.234 | 0.376 | 60.7 |
| Example | 43 | 0.4/0.635/0.4/0.2/1/1/1 | | 0.209 | 0.225 | 7.7 |
| Comparative Example | 44 | 0.4/0.635/0.4/0.2/1/1/1 | | 0.231 | 0.359 | 55.4 |
| Example | 45 | 0.4/0.635/0.4/0.2/1/1/1 | | 0.199 | 0.211 | 6.0 |
| Comparative Example | 46 | 0.4/0.635/0.4/0.2/1/1/1 | | 0.233 | 0.371 | 59.2 |
| Example | 47 | 0.4/0.635/0.4/0.2/1/1/1 | | 0.201 | 0.222 | 10.4 |

(note 1):
nitrogen gas flow rate permeating a plate thickness of 11 mm under pressure of 200 kPa per 0.01 m² in terms of pressurized area It was understood from Table 4 that the specimens of the examples according to the present invention showed a significantly small change in thermal resistance between before and after the heat cycle test, and thus had excellent durability. On the other hand, the specimens of the comparative examples had a thermal resistance that was largely increased due to the application of heat cycles. It was confirmed that the increase of the thermal resistance was caused by the exfoliation of the "metal-carbon bonding interface" or the cracks in the solder layer.

(5) Test for Base-Integrated Insulated Circuit Board Obtained by Molten Metal Bonding. Method A "base-integrated insulated circuit board" having a laminated structure including an aluminum based material and a carbon material bonded to each other was produced by using a cast mold formed of carbon having the cross sectional structure shown in FIG. 4 by the method described in the section (2) "Molten Metal Bonding Method" above. The ceramic material used was an AlN board having a size of 50 mm×50 mm×0.635 mm. The pressure of nitrogen gas pressurizing the molten metal was approximately 100 kPa. The edges of the carbon material protruding from the metal material were cut out and removed, and the surface of the aluminum based material was mechanically polished. For the purpose of removing the unnecessary aluminum based material covering the periphery of the end portions of the AlN board, the prescribed portion was masked, and then an iron chloride aqueous solution was sprayed to dissolve and remove a part of the aluminum based material on the surface of the AlN board, followed by removing the mask with a chemical solution. In the resulting base-integrated insulated circuit board, the metal materials holding the carbon material from both sides thereof were separated from each other, and the area ratio of the region where the carbon material existed occupied in the region where the metal materials holding the carbon material therebetween overlapped each other in the projected area viewed in the laminated direction was 100%. The kind of the carbon material used (No. of the carbon material shown in Table 1), the kind of the aluminum based material used, and the thicknesses of the layers constituting the "base-integrated insulated circuit board" are shown in Table 5. Through holes having a diameter of 6 mm were formed at the four corners of the base-integrated insulated circuit board through machine processing, and the surface except for the portion where the ceramics (AlN) were exposed was subjected to Ni—P electroless plating (medium phosphorus type, plated film thickness: 5 μm), so as to produce a base-integrated insulated circuit board product corresponding to each of the heat radiation members (test specimens) of examples Nos. 61 to 74 in Table 5.

FIG. 10 schematically shows the cross sectional structure of the heat radiation member (test specimen) including the base-integrated insulated circuit board product. Herein, the ceramic material 30 was the AlN board, the symbol 10 denotes the carbon material, and the heat radiation base (i.e., the laminate including the parts denoted by the symbols 21, 10, and 22) had a size of 70 mm×70 mm viewed in the lamination direction (i.e., the z axis direction). The cross section of the heat radiation base including the through holes 80 is shown in the figure. The symbol 81 denotes the plated layer, and the symbols M1, M2, C, and M3 correspond the layers shown in Table 5 respectively.

The heat radiation members (test specimens) were measured for the change in thermal resistance (between the M1 surface and the M3 surface) between before and after the heat cycle test in the same manner as in the section (3) above. The results are shown in Table 5.

the aluminum plate were laminated in this order in such a manner that the brazing material component coated surface of the aluminum plate was brought into contact with the surface of AlN. Multiple plies of the same laminated structure of the aluminum plate, the AlN board, and the aluminum plate as above were further stacked thereon with the spacer intervening therebetween, and the spacer was placed on the uppermost part. The laminate obtained in this manner was heated and retained at 640° C. for 40 minutes under reduced pressure of $10^{-5}$ Pa under application of a uniform load in the lamination direction providing a surface pressure at the lamination interface of 2 MPa, followed by gradually cooling, so as to provide a laminated structure including the aluminum plate, the AlN board, and the aluminum plate bonded to each other. The surface of the aluminum plate of the resulting laminated structure was polished, and then for the purpose of forming a circuit pattern (i.e., a circuit metal plate) and a heat radiation metal plate, the prescribed portion was masked, and then an etching solution of iron chloride was sprayed to dissolve and remove a part of aluminum on the surface of the AlN board, followed by subjecting the surface of the aluminum based material to Ni—P electroless plating, so as to produce an aluminum bonded ceramic circuit board.

TABLE 5

| Class | Example No. | Carbon material | | | | Bonding method of carbon and metal | Test specimen Thicknesses of layers M1/AlN/M2/C/M3 (mm) | Thermal resistance | | |
|---|---|---|---|---|---|---|---|---|---|---|
| | | No. | Thickness (mm) | Gas permeation amount X (note 1) (L/min) | Metal material | | | Initial stage a (K/W) | After heat cycle test b (K/W) | Change rate 100[(b − a)/a] (%) |
| Example | 61 | C1 | 1 | 15.7 | pure Al (≥99.9%) | molten metal bonding method | 0.6/0.635/2/1/0.6 | 0.178 | 0.181 | 1.7 |
| Example | 62 | C4 | 1 | 12.0 | pure Al (≥99.9%) | molten metal bonding method | 0.6/0.635/2/1/0.6 | 0.180 | 0.185 | 2.8 |
| Comparative Example | 63 | C6 | 1 | 0.0 | pure Al (≥99.9%) | molten metal bonding method | 0.6/0.635/2/1/0.6 | 0.188 | 0.262 | 39.4 |
| Example | 64 | C7 | 1 | 22.5 | pure Al (≥99.9%) | molten metal bonding method | 0.6/0.635/2/1/0.6 | 0.172 | 0.171 | −0.6 |
| Comparative Example | 65 | C6 | 1 | 0.0 | Al—0.4Si—0.05B | molten metal bonding method | 0.6/0.635/2/1/0.6 | 0.208 | 0.281 | 35.1 |
| Example | 66 | C7 | 1 | 22.5 | Al—0.4Si—0.05B | molten metal bonding method | 0.6/0.635/2/1/0.6 | 0.192 | 0.193 | 0.5 |
| Comparative Example | 67 | C6 | 1 | 0.0 | Al—0.05Mg—0.04Si | molten metal bonding method | 0.6/0.635/2/1/0.6 | 0.202 | 0.276 | 36.6 |
| Example | 68 | C7 | 1 | 22.5 | Al—0.05Mg—0.04Si | molten metal bonding method | 0.6/0.635/2/1/0.6 | 0.187 | 0.189 | 1.1 |
| Comparative Example | 69 | C6 | 1 | 0.0 | Al—0.08Mg—0.06Si | molten metal bonding method | 0.6/0.635/2/1/0.6 | 0.208 | 0.281 | 35.1 |
| Example | 70 | C7 | 1 | 22.5 | Al—0.08Mg—0.06Si | molten metal bonding method | 0.6/0.635/2/1/0.6 | 0.192 | 0.193 | 0.5 |
| Comparative Example | 71 | C6 | 1 | 0.0 | Al—0.2Zr | molten metal bonding method | 0.6/0.635/2/1/0.6 | 0.214 | 0.288 | 34.6 |
| Example | 72 | C7 | 1 | 22.5 | Al—0.2Zr | molten metal bonding method | 0.6/0.635/2/1/0.6 | 0.199 | 0.201 | 1.0 |
| Comparative Example | 73 | C6 | 1 | 0.0 | Al—0.2Zn | molten metal bonding method | 0.6/0.635/2/1/0.6 | 0.221 | 0.295 | 33.5 |
| Example | 74 | C7 | 1 | 22.5 | Al—0.2Zn | molten metal bonding method | 0.6/0.635/2/1/0.6 | 0.206 | 0.205 | −0.5 |

(note 1):
nitrogen gas flow rate permeating a plate thickness of 11 mm under pressure of 200 kPa per 0.01 m² in terms of pressurized area (6) Test for Base-Integrated Insulated Circuit Board Obtained by Brazing Method An aluminum plate (purity: 99.9% or more) having a size of 48 mm×48 mm×0.3 mm and an AlN board having a size of 50 mm×50 mm×0.635 mm were prepared, and a brazing material component element (Si) was coated on one surface of the aluminum plate in a coating amount of approximately 0.5 mg/cm² by a sputtering method. On a spacer formed of an alumina board, the aluminum plate, the AlN board, and FIG. 11 schematically shows the cross sectional structure of the heat radiation member (test specimen) including the base-integrated insulated circuit board produced by the brazing method. Herein, the ceramic material 30 was the AlN board, the circuit metal material 41 and the heat radiation metal material 42 were plate materials of the aluminum based material, and the laminate including the parts denoted by the symbols 41, 30, and 42 corresponded to the aluminum bonded ceramic circuit board. The symbol 10 denotes the plate material of the carbon material, the metal materials 21 and 22 were the plate materials of the aluminum based material, and the laminate portion denoted by the symbols 21, 10, and 22 corresponded to the heat radiation base. A plate material 83 of aluminum (purity: 99.9% or more, thickness: 0.3 mm) was further bonded on the aluminum bonded ceramic circuit board by brazing. A peripheral wall formed of an aluminum block (purity: 99.9% or more, thickness: 1.535 mm) was disposed by brazing.

In brazing, the element of the brazing material component was coated by a sputtering method in advance in a coated amount of approximately 0.5 g/cm$^2$ on one surface of the aluminum based material plate denoted by the symbol 83, the surface of the aluminum based material plate denoted by the symbol 42 constituting the aluminum bonded ceramic circuit board, one surface of each of the aluminum based material plates denoted by the symbols 21 and 22 bonded with the carbon material 10, and the lower surface of the aluminum based material constituting the peripheral wall 82. The plate materials, the aluminum bonded ceramic circuit board, and the aluminum based material constituting the peripheral wall 82 were laminated in the configuration shown in FIG. 11, and were brazed in such a manner that the laminate was heated and retained at 640° C. for 40 minutes under reduced pressure of 10$^{-5}$ Pa under application of a load providing a surface pressure at the lamination interface of 2 MPa in the lamination direction (i.e., the z axis direction shown in FIG. 11) via a plate spacer formed of ceramics, followed by gradually cooling. The aluminum based material plates denoted by the symbols 83, 21, and 22 had the same composition. The brazing material component was common to all the parts. The kind of the carbon material used (No. of the carbon material shown in Table 1), the kind of the aluminum based material denoted by the symbols 83, 21, and 22, the element of the brazing material, and the thicknesses of the layers constituting the "base-integrated insulated circuit board" are shown in Table 6. The through holes 80 having a diameter of 6 mm were formed at the four corners penetrating the peripheral wall 82 of the base-integrated insulated circuit board through machine processing, and the surface except for the portion where the ceramics (AlN) were exposed was subjected to Ni—P electroless plating (medium phosphorus type, plated film thickness: 5 μm), so as to produce a base-integrated insulated circuit board product corresponding to each of the heat radiation members (test specimens) of examples Nos. 75 to 82 in Table 6. The heat radiation base (i.e., the laminate including the parts denoted by the symbols 21, 10, and 22) had a size of 70 mm×70 mm viewed in the lamination direction (i.e., the z axis direction). The cross section of the heat radiation base including the through holes 80 is shown in the figure. The symbol 81 denotes the plated layer, and the symbols M1, AlN, M2, M3, C, and M4 correspond the layers shown in Table 6 respectively.

The heat radiation members (test specimens) were measured for the change in thermal resistance (between the M1 surface and the M4 surface) between before and after the heat cycle test in the same manner as in the section (3) above. The results are shown in Table 6.

TABLE 6

| Class | Example No. | Carbon material | | | | Metal material | Bonding method of carbon and metal | Test specimen Thicknesses of layers M1/AlN/M2/M3/C/M4 (mm) | Thermal resistance | | |
| | | No. | Thickness (mm) | Gas permeation amount X (note 1) (L/min) | | | | | Initial stage a (K/W) | After heat cycle test b (K/W) | Change rate 100[(b − a)/a] (%) |
|---|---|---|---|---|---|---|---|---|---|---|---|
| Comparative Example | 75 | C6 | 1 | 0.0 | pure Al (≥99.9%) | brazing method (Si) | 0.6/0.635/0.3/2/1/0.6 | 0.193 | 0.300 | 55.4 |
| Example | 76 | C7 | 1 | 22.5 | pure Al (≥99.9%) | brazing method (Si) | 0.6/0.635/0.3/2/1/0.6 | 0.178 | 0.180 | 1.1 |
| Comparative Example | 77 | C6 | 1 | 0.0 | pure Al (≥99.9%) | brazing method (Cu) | 0.6/0.635/0.3/2/1/0.6 | 0.192 | 0.311 | 62.0 |
| Example | 78 | C7 | 1 | 22.5 | pure Al (≥99.9%) | brazing method (Cu) | 0.6/0.635/0.3/2/1/0.6 | 0.181 | 0.188 | 3.9 |
| Comparative Example | 79 | C6 | 1 | 0.0 | pure Al (≥99.9%) | brazing method (Ag) | 0.6/0.635/0.3/2/1/0.6 | 0.195 | 0.299 | 53.3 |
| Example | 80 | C7 | 1 | 22.5 | pure Al (≥99.9%) | brazing method (Ag) | 0.6/0.635/0.3/2/1/0.6 | 0.184 | 0.181 | −1.6 |
| Comparative Example | 81 | C6 | 1 | 0.0 | pure Al (≥99.9%) | brazing method (Ge) | 0.6/0.635/0.3/2/1/0.6 | 0.193 | 0.310 | 60.6 |
| Example | 82 | C7 | 1 | 22.5 | pure Al (≥99.9%) | brazing method (Ge) | 0.6/0.635/0.3/2/1/0.6 | 0.177 | 0.199 | 12.4 |

(note 1):
nitrogen gas flow rate permeating a plate thickness of 11 mm under pressure of 200 kPa per 0.01 m$^2$ in terms of pressurized area It was understood from Tables 5 and 6 that the specimens of the examples according to the present invention showed a significantly small change in thermal resistance between before and after the heat cycle test, and thus had excellent durability. On the other hand, the specimens of the comparative examples had a thermal resistance that was largely increased due to the application of heat cycles. It was confirmed that the increase of the thermal resistance was caused by the exfoliation of the "metal-carbon bonding interface".

What is claimed is:

1. A method for producing a heat radiation member comprising charging a molten metal of aluminum or an aluminum alloy in a cast mold having a carbon material having a following property (A) disposed therein, so as to fill a space inside the cast mold with the molten metal, and then solidifying the molten metal, so as to form a laminated structure including a metal material containing aluminum or an aluminum alloy and the carbon material bonded to each other;

(A) in pressurizing one principal surface of a plate specimen having a thickness of 11 mm of the carbon material with nitrogen gas of 200 kPa, the carbon material having a gas permeability of the nitrogen gas permeating to the other principal surface with a flow rate of 5 L/min or more and 30 L/min or less per 0.01 $m^2$ in terms of area of the pressurized principal surface, the pressurized principal surface having an area of 0.005 $m^2$ or more.

2. The method for producing a heat radiation member according to claim 1, wherein the carbon material has a bending strength of 40 MPa or more.

* * * * *